(12) United States Patent
Sashida

(10) Patent No.: US 7,884,404 B2
(45) Date of Patent: Feb. 8, 2011

(54) FERROELECTRIC MEMORY DEVICE AND FABRICATION PROCESS THEREOF, FABRICATION PROCESS OF A SEMICONDUCTOR DEVICE

(75) Inventor: Naoya Sashida, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 529 days.

(21) Appl. No.: 12/037,286

(22) Filed: Feb. 26, 2008

(65) Prior Publication Data
US 2008/0142915 A1 Jun. 19, 2008

Related U.S. Application Data

(63) Continuation of application No. PCT/JP2005/016042, filed on Sep. 1, 2005.

(51) Int. Cl.
H01L 27/105 (2006.01)
(52) U.S. Cl. .................. 257/295; 257/E27.104; 257/E21.664; 438/3
(58) Field of Classification Search .............. 257/295, 257/E27.104, E21.663, E21.664; 438/3
See application file for complete search history.

(56) References Cited

U.S. PATENT DOCUMENTS

| | | | |
|---|---|---|---|
| 6,600,183 B1 | 7/2003 | Visokay et al. | |
| 6,656,748 B2 * | 12/2003 | Hall et al. | 438/3 |
| 6,713,342 B2 * | 3/2004 | Celii et al. | 438/239 |
| 6,767,750 B2 * | 7/2004 | Summerfelt et al. | 438/3 |
| 6,773,930 B2 * | 8/2004 | Summerfelt et al. | 438/3 |
| 6,828,161 B2 * | 12/2004 | Summerfelt et al. | 438/3 |
| 7,029,925 B2 * | 4/2006 | Celii et al. | 438/3 |
| 7,763,921 B2 * | 7/2010 | Wang | 257/298 |
| 2003/0143853 A1 * | 7/2003 | Celii et al. | 438/694 |

(Continued)

FOREIGN PATENT DOCUMENTS

EP 0889519 A2 1/1999

(Continued)

OTHER PUBLICATIONS

Chinese Office Action dated Mar. 20, 2009, issued in corresponding Chinese Patent Application No. 2005800514339.

(Continued)

Primary Examiner—Anh Phung
Assistant Examiner—Michael Lulis
(74) Attorney, Agent, or Firm—Westerman, Hattori, Daniels & Adrian, LLP

(57) ABSTRACT

A ferroelectric memory device includes a field effect transistor formed over a semiconductor substrate and including first and second diffusion regions, an interlayer insulation film formed over the semiconductor substrate so as to cover the field effect transistor, a conductive plug formed in the interlayer insulation film in contact with the first diffusion region, and a ferroelectric capacitor formed over the interlayer insulation in contact with the conductive plug. The ferroelectric capacitor includes a ferroelectric film and upper and lower electrodes sandwiching the ferroelectric film respectively from above and below. The lower electrode is connected electrically to the conductive plug, and wherein a layer containing aluminum and oxygen is interposed between the conductive plug and the lower electrode, a layer containing nitrogen is interposed between the layer containing aluminum and oxygen and the lower electrode, and a self-aligned layer of a substance having a self-orientation is interposed between the layer containing nitrogen and the lower electrode.

15 Claims, 26 Drawing Sheets

U.S. PATENT DOCUMENTS

| | | |
|---|---|---|
| 2005/0205911 A1 | 9/2005 | Udayakumar et al. |
| 2008/0061345 A1* | 3/2008 | Wang .......................... 257/306 |
| 2008/0111172 A1* | 5/2008 | Wang et al. .................. 257/295 |
| 2008/0261332 A1* | 10/2008 | Wang et al. ..................... 438/3 |
| 2009/0026514 A1* | 1/2009 | Wang .......................... 257/295 |

FOREIGN PATENT DOCUMENTS

| | | |
|---|---|---|
| JP | 11-74488 A | 3/1999 |
| JP | 2004-153031 A | 5/2004 |
| JP | 2004-311470 A | 11/2004 |
| JP | 2005-268801 A | 9/2005 |

OTHER PUBLICATIONS

International Search Report of PCT/JP2005/016042, date of mailing Nov. 22, 2005.

* cited by examiner

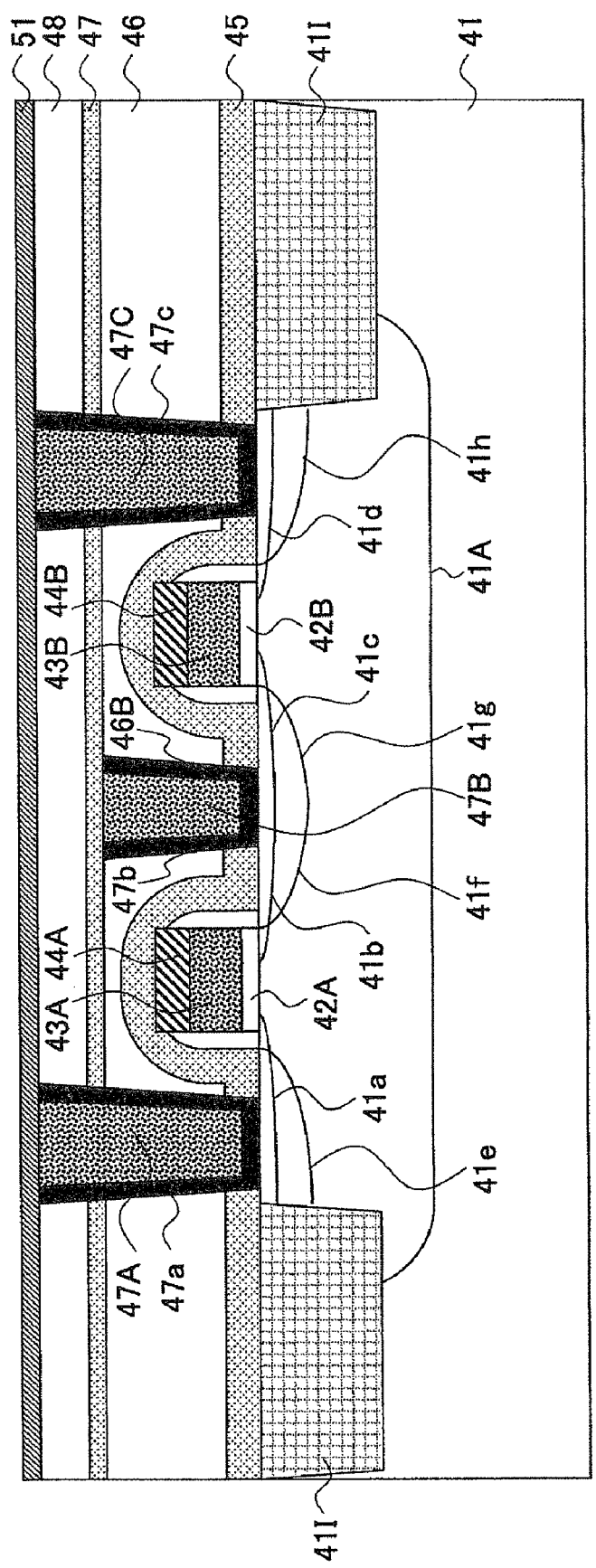

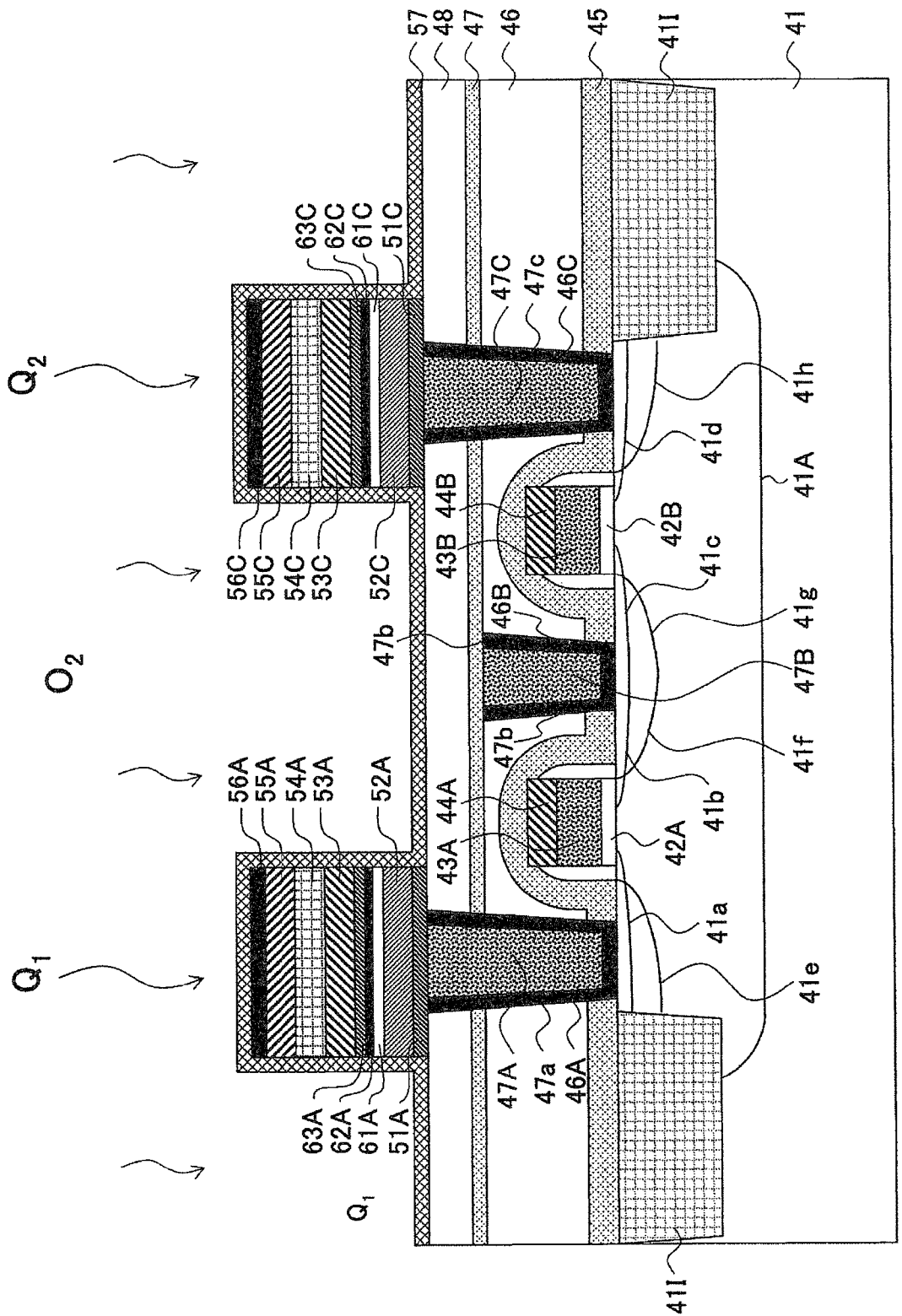

US 7,884,404 B2

FERROELECTRIC MEMORY DEVICE AND FABRICATION PROCESS THEREOF, FABRICATION PROCESS OF A SEMICONDUCTOR DEVICE

CROSS-REFERENCE TO RELATED APPLICATIONS

The present embodiment is a continuation application filed under 35 U.S.C. 111(a) claiming benefit under 35 U.S.C. 120 and 365(c) of PCT application JP2005/016042 filed on Sep. 1, 2005, the entire contents thereof are incorporated herein as reference.

BACKGROUND

The present embodiment generally relates to semiconductor devices and more particularly to a semiconductor device having a ferroelectric capacitor and fabrication process thereof.

A ferroelectric memory is a non-volatile voltage-driven semiconductor memory device and is characterized by preferable feature of high operational speed, low electric power consumption and non-volatility of information in that the information held therein is retained even when the electric power is turned off. Ferroelectric memories are already used in IC cards and other portable electronic apparatuses.

FIG. 1 is a cross-sectional diagram showing the construction of a ferroelectric memory device 10 called stacked type device.

Referring to FIG. 1, the ferroelectric memory device 10 is a so-called 1T1C device and includes two memory cell transistors formed in a device region 11A defined on a silicon substrate 11 by a device isolation region 11I such that the two memory cell transistors share a bit line.

More specifically, there is formed an n-type well in the silicon substrate 11 as the device region 11A, wherein there are formed, on the device region 11A, a first MOS transistor having a polysilicon gate electrode 13A and a second MOS transistor having a polysilicon gate electrode 13B via respective gate insulation films 12A and 12B.

Further, LDD regions 11a and 11b of p⁻-type are formed in the silicon substrate 11 in correspondence to respective sidewalls of the gate electrode 13A. Similarly, LDD regions 11c and 11d of p⁻-type are formed in the silicon substrate 11 in correspondence to respective sidewalls of the gate electrode 13B. Thereby, the first and second MOS transistors are formed commonly in the device region 11A, and thus, the same p⁻-type diffusion region is, used as the LDD region 11b and the LDD region 11c.

On the polysilicon gate electrode 13A, there is formed a silicide layer 14A, while on the polysilicon gate electrode 13B, there is formed a silicide layer 14B. Further, respective sidewall insulation films are formed on both sidewall surfaces of the polysilicon gate electrodes 13A and 13B.

Furthermore, diffusion regions 11e and 11f of p⁺-type are formed in the silicon substrate 11 at respective outer sides of the sidewall insulation films of the gate electrode 13A, and diffusion regions 11g and 11h of p⁺-type are formed in the silicon substrate 11 at respective outer sides of the sidewall insulation films of the gate electrode 13B. Thereby, the same p⁺-type diffusion region is used commonly for the diffusion regions 11f and 11g.

Further, on the silicon substrate 11, there is formed an SiON film 15 so as to cover the gate electrode 13A including the silicide layer 14A and the sidewall insulation films of the gate electrode 13A and so as to cover the gate electrode 13B including the silicide layer 14B and the sidewall insulation films on the gate electrode 13B, and an interlayer insulation film 16 of $SiO_2$ is formed on the SiON film 15. Further, contact holes 16A, 16B and 16C are formed in the interlayer insulation film 16 so as to expose the diffusion region 11e, the diffusion region 11f (the diffusion region 11g), and the diffusion region 11h, respectively, wherein via-plugs 17A, 17B and 17C of W (tungsten) are formed in the respective contact holes 16A, 16B and 16C via adhesive layers 17a, 17b and 17c, wherein each of the adhesive layers 17a, 17b and 17c is formed by lamination of a Ti film and a TiN film.

Further, on the interlayer insulation film 16, there is formed a first ferroelectric capacitor C1 in which a lower electrode 18A, a polycrystalline ferroelectric film 19A and an upper electrode 20A are stacked in contact with the tungsten plug 17A. Similarly, a second ferroelectric capacitor C2 is formed on the interlayer insulation film 16 by stacking of a lower electrode 18C, a polycrystalline ferroelectric film 19C and an upper electrode 20C in contact with the tungsten plug 17C.

Further, a hydrogen barrier film 21 of $Al_2O_3$ is formed on the interlayer insulation film 16 so as to cover the ferroelectric capacitors C1 and C2, and a next interlayer insulation film 22 is formed further on the hydrogen barrier film 21.

Further, in the interlayer insulation film 22, there are formed a contact hole 22A exposing the upper electrode 20A of the ferroelectric capacitor C1, a contact hole 22B exposing the via-plug 17B, and a contact hole 22C exposing the upper electrode 20C of the ferroelectric capacitor C2, wherein the contact holes 22A-22C are formed respectively with tungsten plugs 23A, 23B and 23C via respective adhesive layers 23a, 23b and 23c formed by lamination of a Ti film and a TiN film.

Further, Al interconnection patterns 24A, 24B and 24 C are formed on the interlayer insulation film 22 respectively in correspondence to the tungsten plugs 23A, 23B and 23C with a barrier metal film of the Ti/TiN layered structure.

SUMMARY

It is an aspect of the embodiments discussed herein to provide a ferroelectric memory device, including a semiconductor substrate; a field effect transistor formed over the semiconductor substrate, the field effect transistor including first and second diffusion regions; an interlayer insulation film formed over the semiconductor substrate so as to cover the field effect transistors conductive plug formed in the interlayer insulation film in contact with the first diffusion region; and a ferroelectric capacitor formed over the interlayer insulation in contact with the conductive plug, the ferroelectric capacitor including a ferroelectric film and upper and lower electrodes sandwiching the ferroelectric film respectively from above and below, the lower electrode being connected electrically to the conductive plug, a layer containing aluminum and oxygen being interposed between the conductive plug and the lower electrode, a layer containing nitrogen being interposed between the layer containing aluminum and oxygen and the lower electrode, a self-aligned layer of a material showing a self-alignment being interposed between the layer containing nitrogen and the lower electrode.

DETAILED DESCRIPTION OF THE PREFERRED EMBODIMENTS

In such a ferroelectric memory device, crystal orientation of the ferroelectric films 19A and 19C in the ferroelectric capacitors C1 and C2 may be important.

The so-called perovskite film such as PZT ($Pb(Zr,Ti)O_3$) belongs to tetragonal crystal system, and spontaneous polarization characterizing ferroelectricity is caused by displacement of Zr or Ti atoms in the crystal lattice in the c-axis direction. Thus, when forming a capacitor insulation film of a ferroelectric capacitor by using such a polycrystalline perovskite film, it is ideal that the individual crystal grains constituting the ferroelectric film have respective c-axes aligned in a direction parallel to the direction in which the electric field is applied, and hence perpendicularly to the surface of the capacitor insulation film ((001) orientation). Contrary to this, when the c-axis has aligned in an in-plane direction of the capacitor insulation film ((100) orientation), it is not possible to induce the desired spontaneous polarization even when a drive voltage is applied to the capacitor.

However, the difference between the c-axis and the a-axis small in the perovskite film, and there arises a situation, when the PZT film is formed by a usual manufacturing method, that the crystal grains of the (001) orientation and the crystal grains of the (100) orientation occur more or less with the same proportion. Further, by taking into consideration the fact that there may occur crystal grains of other directions, the proportion of the crystal grains that contribute to the operation of the ferroelectric capacitor is small. Under these circumstances, it has been practiced in the art of ferroelectric memory, to form each of the ferroelectric films 19A and 19C in the form of predominantly (111)-oriented film. Thereby the c-axes of the crystal grains are aligned in the <111>-direction, and large switching electric charge QSW is guaranteed.

In order to realize such orientation control of the ferroelectric film, it is very important to control the crystal orientation of the lower electrodes 18A and 18C, and thus, a Ti film that shows a strong self-organized alignment is used in the lower electrodes 18A and 18C as an orientation control film. Thereby, a metal or conductive oxide film of (111) orientation, such as a film of Ir, Pt, IrOx, RuOx, and the like, is formed on such an orientation control film. The self-oriented Ti film shows a (002) orientation.

Figure 1:
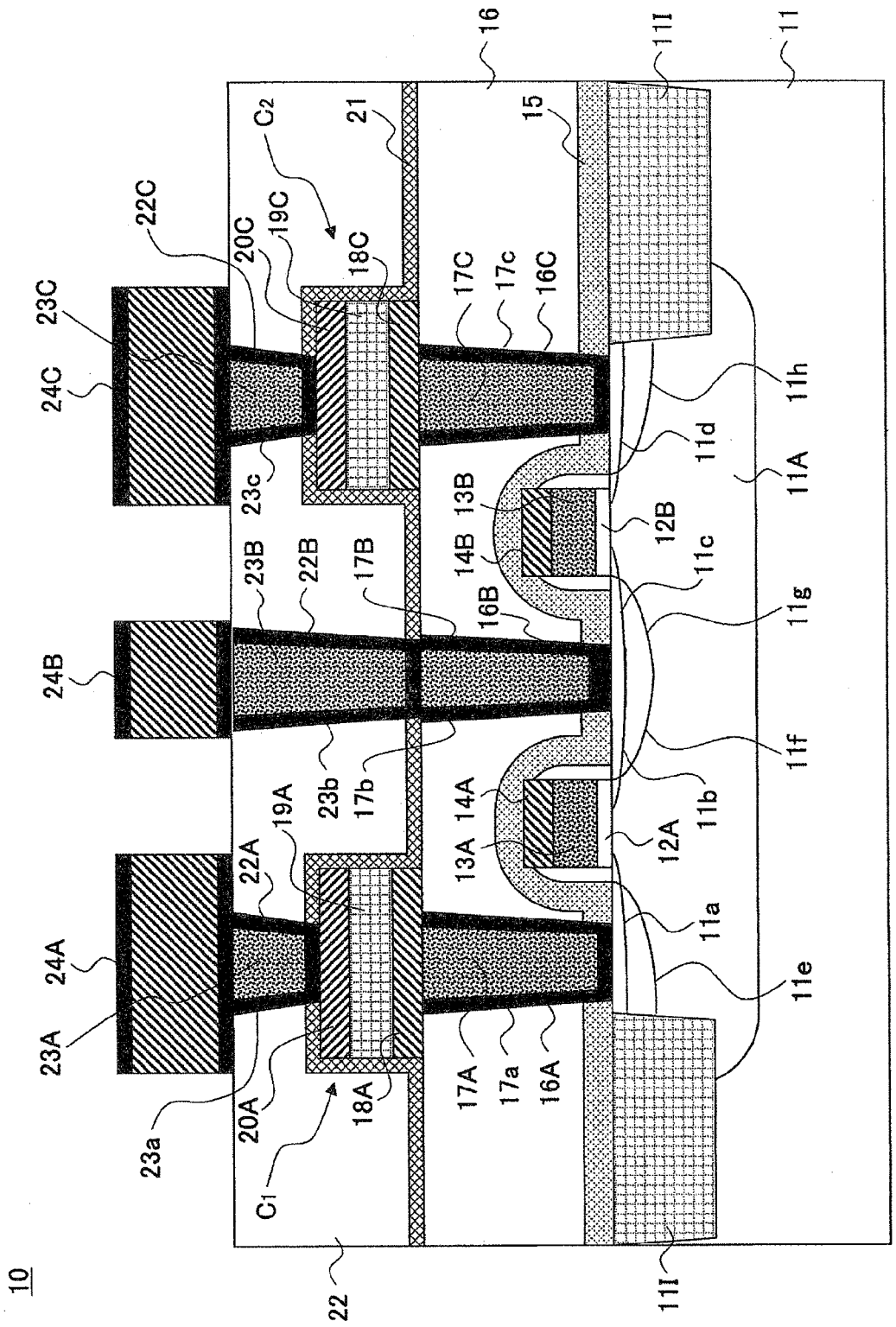
FIG. 1 a diagram showing the construction of a conventional ferroelectric memory device.
Figure 2:
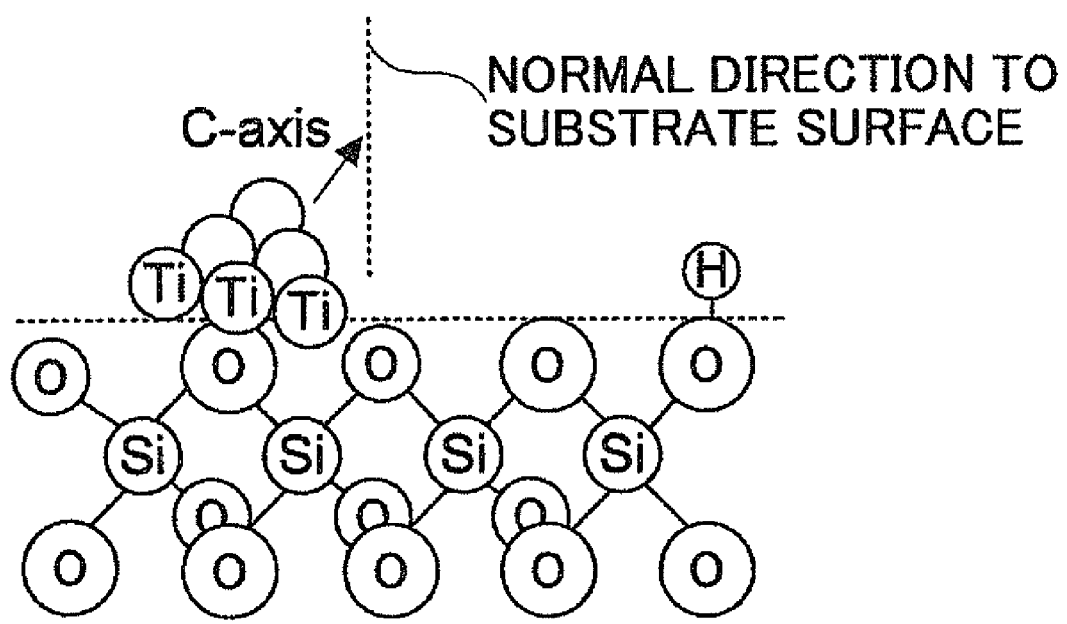
FIG. 2 is a diagram explaining the problems of conventional technology.

However, when a Ti film is used as the orientation control film, there arises a problem, when the deposition of the Ti film is caused on a surface where oxygen atoms are exposed as in the case of a silicon oxide film shown in the example of FIG. 1, in that the highly reactive Ti atoms thus deposited develop immediately a strong bond with the oxygen atoms at the film surface as shown in FIG. 2, and occurrence of the desired self alignment of the Ti film, caused as a result of the Ti atoms moving freely over the film surface, is prevented. Thereby, the proportion of the crystal grains having the desired (002) orientation is decreased in the Ti film thus obtained. Further, there arises a case in which the c-axes of the crystal grains that constitute the Ti film are aligned obliquely to the principal surface of the oxide film 16 as schematically shown in FIG. 2, and there are formed large number of crystal grains with the orientation other than the (002) orientation.

Figure 3:
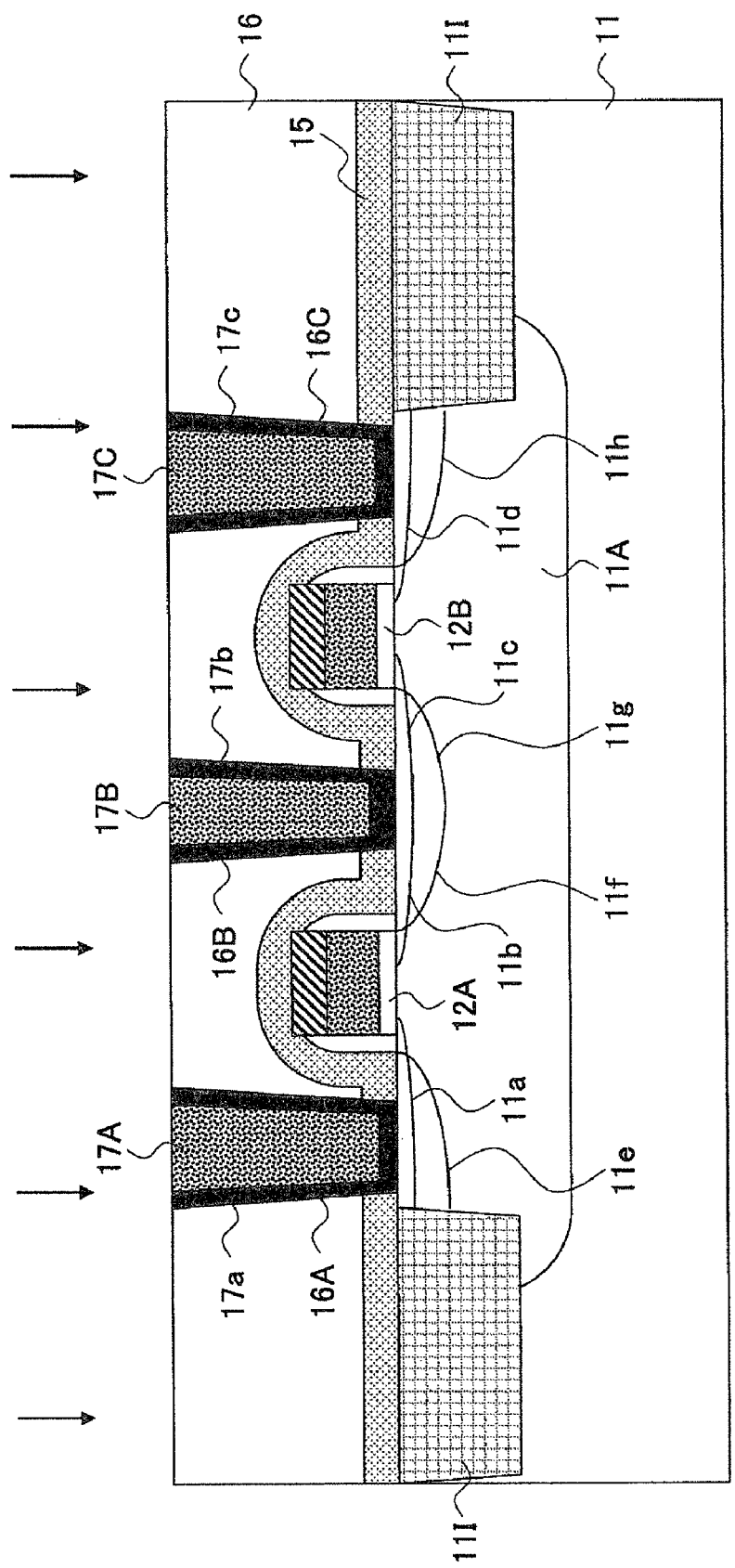
FIG. 3 is a diagram explaining a related art of the present embodiment.
Figure 4:
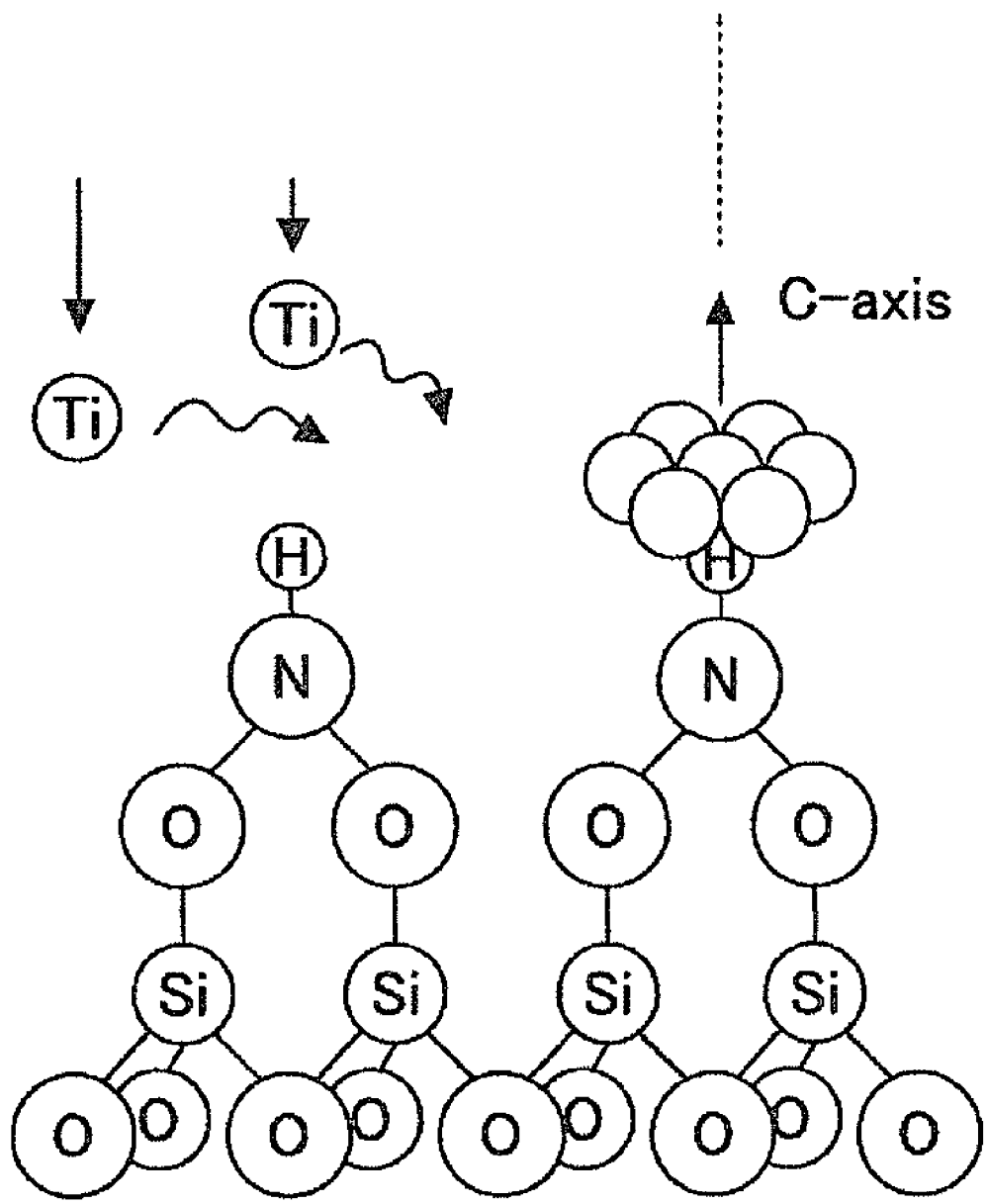
FIG. 4 is a diagram explaining the principle of the related art of FIG. 3.

Thus, Patent Reference 1 describes the technology of bonding NH groups to the oxygen atoms at the surface of the interlayer insulation film 16 as shown in FIG. 4 with the timing in which the structure of FIG. 1 has been formed up to the contact plugs 17A-17C as shown in FIG. 3, by processing the surface of the interlayer insulation film 16 with $NH_3$ plasma.

According to such a construction, the Ti atoms deposited on the interlayer insulation film are not captured by the oxygen atoms as shown in FIG. 4, and the Ti atoms can move freely over the surface of the interlayer insulation film. Thereby, there is formed a Ti self-organized film having the (002) orientation on the interlayer insulation film 16.

Thus, by forming the lower electrodes 18A and 18C on the Ti film thus formed and further forming the ferroelectric film 19A or 19C thereon, it becomes possible to obtain a ferroelectric film in which the crystal grains are predominantly in the (111) orientation.

In the technology of Patent Reference 1, however, the lower electrode 18A or 18C are formed directly on the W plug 17A or 17C, and thus, it is not possible to shield the influence of the crystal orientation of the crystals constituting the surface of the plugs 17A and 17C. It should be noted that the plugs 17A and 17C are formed of polycrystalline metal such as polycrystalline tungsten, and the like. This means that, in the majority part of the ferroelectric films 19A and 19C, the orientation control by the self-aligned Ti film is not attained effectively.

Patent Reference 1
Japanese Laid-Open Patent Application 2004-153031

Patent Reference 2
Japanese Laid-Open Patent Application 2004-311470

Figure 5:
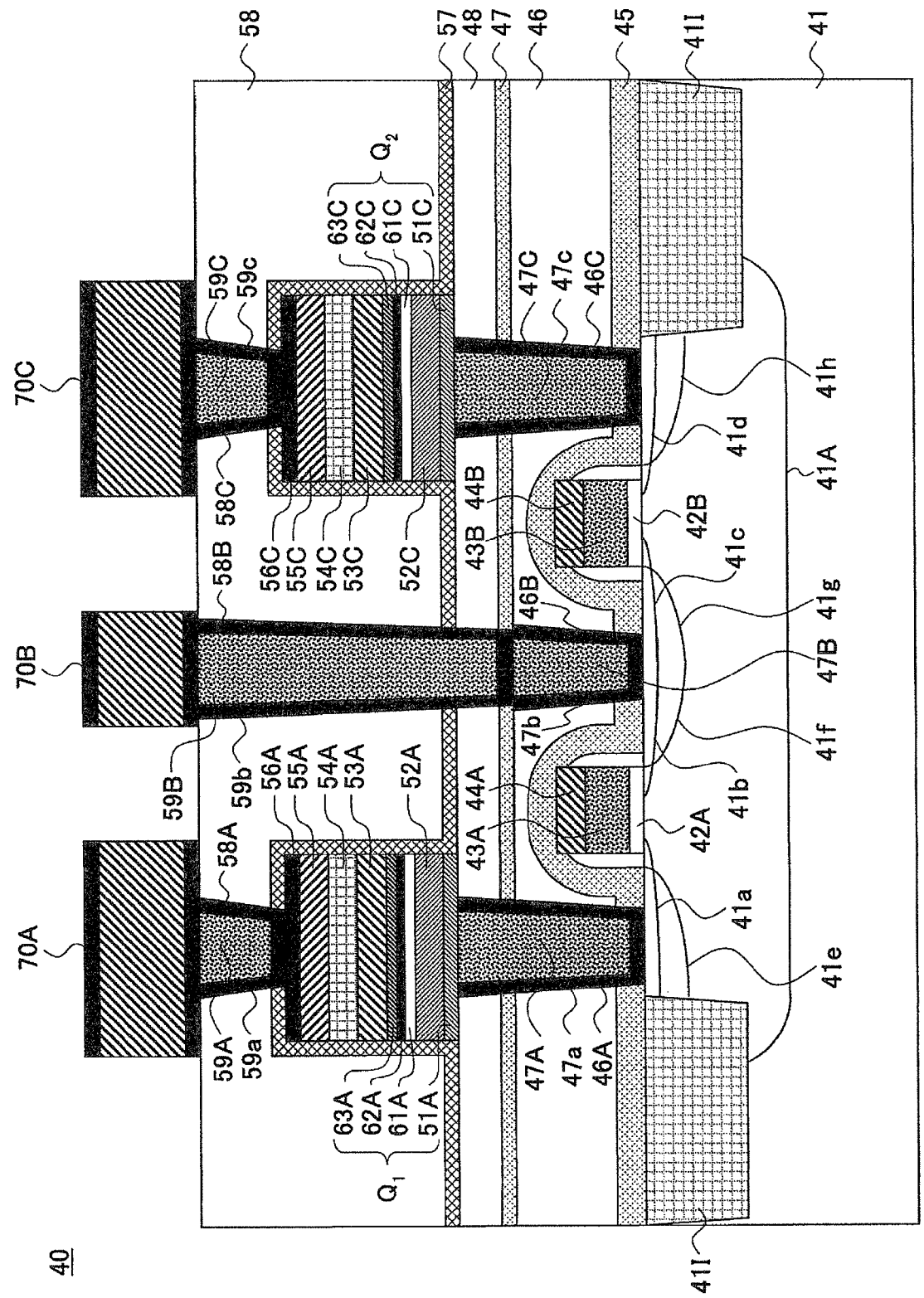
FIG. 5 is a diagram showing the construction of a ferroelectric memory device according to a first embodiment.

FIG. 5 shows the construction of a ferroelectric memory 40 according to a first embodiment.

Referring to FIG. 5, the ferroelectric memory device 40 is a so-called 1T1C type device and includes two memory cell transistors formed in a device region 41A defined on a silicon substrate 41 by a device isolation region 41I of STI (shallow trench isolation) type, so as to share a bit line.

More specifically, there is formed an n-type well in the silicon substrate 41 as the device region 41A, wherein there are formed a first MOS transistor having a polysilicon gate electrode 43A and a second MOS transistor having a polysilicon gate electrode 43B on the device region 41A respectively via a gate insulation film 42A and a gate insulation film 42B.

In the silicon substrate 41, there are formed LDD regions 41a and 41b of p⁻-type in correspondence to respective sidewalls of the gate electrode 43A, and there are further formed LDD regions 41c and 41d of p⁻-type in correspondence to respective sidewalls of the gate electrode 43B. Here it should be noted that because the first and second MOS transistors are formed in the device region 41A commonly, the same p⁻-type diffusion region is used as the LDD region 41b and the LDD region 41c.

On the polysilicon gate electrodes 43A and 43B, there are formed silicide layers 44A and 44B, respectively, and there are further formed sidewall insulation films on the sidewall surfaces of the polysilicon gate electrode 43A and on the sidewall surfaces of the polysilicon gate electrode 43B, respectively.

Further, diffusion regions 41e and 41f of p⁺-type are formed in the silicon substrate 41 at respective outer sides of the sidewall insulation films of the gate electrode 43A, and diffusion regions 41g and 41h of p⁺-type are formed in the silicon substrate 41 at respective outer sides of the sidewall insulation films of the gate electrode 43B. Thereby, the same p⁺-type diffusion region is used commonly for the diffusion regions 41f and 41g.

Further, there is formed a SiON film 45 on the silicon substrate 41 so as to cover the silicide layer 44A and the gate electrode 43A including the sidewall insulation films formed thereon and so as to cover the silicide layer 44B and the gate electrode 43B including the sidewall insulation films formed thereon. On the SiON film 45, an interlayer insulation film 46 of $SiO_2$, a first antioxidation film 47 of SiN or SiON, and an interlayer insulation film 48 of TEOS are formed consecutively.

Further, contact holes 46A and 46C are formed through the interlayer insulation films 46 and 48 and also through the antioxidation film 47 so as to expose the diffusion regions 41e and 41h, and via-plugs 47A and 47C of W (tungsten) are formed in the contact holes 46A and 46C respectively via adhesive layers 47a and 47c, wherein the adhesive layers 47a and 47c are formed of lamination of a Ti film and a TiN film. Further, a contact hole 46B is formed in the interlayer insulation film 46 so as to expose the diffusion region 41f and thus, the diffusion region 41g, wherein a via-plug 47B of W is formed in the contact hole 46B via an adhesive layer 47b, wherein the adhesive layer 47b is formed of lamination of a Ti film and a TiN film similarly to the adhesive layers 47a and 47c.

Furthermore, there is formed a first ferroelectric capacitor Q1 on the interlayer insulation film 48 in contact with the tungsten plug 47A via a Ti adhesion layer 51A, wherein the first ferroelectric capacitor Q1 is formed of a lower electrode in which a TiAlN film 52A of the thickness of 100 nm and an Ir film 53A of the thickness of 100 nmm are laminated, and a polycrystalline ferroelectric film 54A of PZT is formed thereon with a thickness of 120 nm. Further, and an upper electrode 55A of $IrO_2$ is formed on the ferroelectric film 24A with a thickness 200 nm. Similarly, there is formed a second ferroelectric capacitor Q2 in contact with the tungsten plug 47C via a Ti adhesion layer 51C, such that the second ferroelectric capacitor Q2 is formed of a lower electrode in which a TiAlN film 52C of the thickness of 100 nm and an Ir film 53C of the thickness of 100 nmm are laminated, and a polycrystalline ferroelectric film 54C of PZT is formed thereon with a thickness of 120 nm. Further, an upper electrode 55C of $IrO_2$ is formed on the ferroelectric film 54C with a thickness 200 nm. Thereby, it should be noted that the TiAlN films 52A and 52C function as an oxygen barrier film blocking penetration of oxygen into the via plugs 47A and 47C.

In the present embodiment, there is interposed an insulation layer 61A containing oxygen and having the composition of predominantly $Al_2O_3$ between the TiAlN layer oxygen barrier film 52A and the lower electrode 53A with a thickness of one or more molecular layers but not exceeding 10 nm, and there is further formed a layer 62A containing nitrogen atoms on the insulation layer 61A such that the nitrogen atoms in the layer 62A form a bond to the oxygen atoms in the insulation layer 61A. Further, with the present embodiment, there is formed a Ti film 63A of (002) orientation on the layer 62A containing nitrogen with a thickness of 20 nm, and the lower electrode 53A is formed on such a (002) oriented Ti film 63A.

Similarly, there is interposed an insulation layer 61C containing oxygen and having the composition of predominantly $Al_2O_3$ between the TiAlN layer oxygen barrier film 52C and the lower electrode 53C with a thickness of one or more molecular layers but not exceeding 10 nm, and there is further formed a layer 62C containing nitrogen atoms on the insulation layer 61C such that the nitrogen atoms in the layer 62C form a bond to the oxygen atoms in the insulation layer 61C. Further, with the present embodiment, there is formed a Ti film 63C of (002) orientation on the layer 62C containing nitrogen with a thickness of 20 nm, and the lower electrode 53C is formed on such a (002) oriented Ti film 63C.

With such a construction, the orientation of the lower electrode film 53A formed on the Ti film 51A of the (002) orientation is aligned in the <111> direction, and because of this, the PZT film 54A formed thereon has an orientation aligned in the <111> direction. Similarly, the orientation of the lower electrode film 53C formed on the Ti film 51C of the (002) orientation is aligned in the <111> direction, and because of this, the PZT film 54C formed thereon has an orientation aligned in the <111> direction. As a result, each of the ferroelectric capacitors Q1 and Q2 has a preferable feature of large switching electric charge $Q_{SW}$.

Further, there is formed a hydrogen barrier film 57 of $Al_2O_3$ on the interlayer insulation film 48 with the film thickness of 10 nm so as to cover the ferroelectric capacitors Q1 and Q2, and a next interlayer insulation film 58 is formed on the hydrogen barrier film 57.

Further, there are formed a contact hole 58A exposing the hydrogen barrier metal film 56A on the upper electrode 55A of the ferroelectric capacitor Q1, a contact hole 58B exposing the via-plug 46B, and a contact hole 58C exposing the hydrogen barrier metal film 56C on the upper electrode 55C of the ferroelectric capacitor Q2 in the interlayer insulation film 58, wherein a tungsten plug 59A is formed in the contact hole 58A via an adhesive layer 59a in which a Ti film and a TiN film are laminated, a tungsten plug 59B is formed in the contact hole 58B via an adhesive layer 59b in which a Ti film and a TiN film are laminated, and a tungsten plug 59C is formed in the contact hole 58C via an adhesive layer 59c in which a Ti film and a TiN film are laminated.

Further, in correspondence to the tungsten plugs 59A, 59B and 59C, there are formed Al interconnection patterns 70A, 70B and 70C on the interlayer insulation film 58 each with a corresponding barrier metal film of Ti/TiN laminated structure.

In the present embodiment, it is obvious that the conductivity type can be reversed.

Next, the fabrication process of the ferroelectric memory device 40 of FIG. 5 will be explained with reference to FIGS. 6A-6O.

Figure 6A:
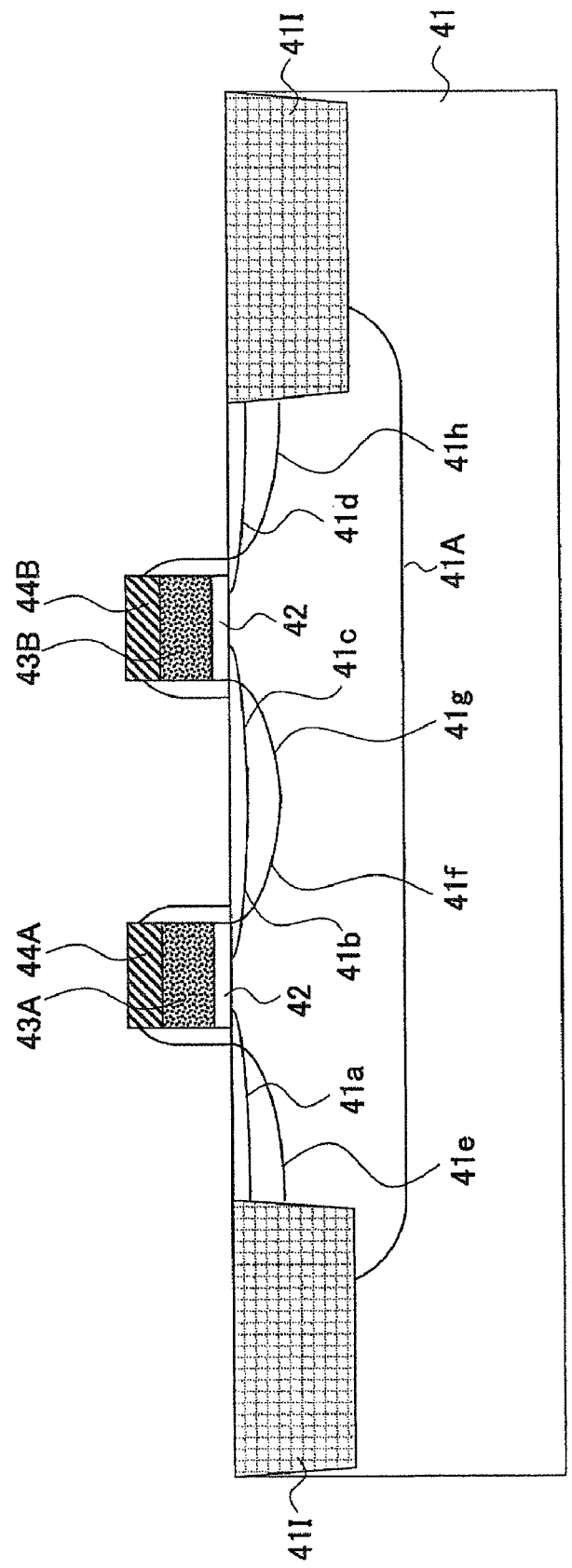
FIGS. 6A-6O are diagrams showing the fabrication process of the ferroelectric memory device of FIG. 5.

Referring to FIG. 6A, the substrate 41 is a silicon substrate of p-type or n-type and the device region 41A is defined in the substrate 41 in the form of an n-type well by the STI device isolation structure 41I.

On the device region 41A, there are formed a polysilicon gate electrode 43A of the first MOS transistor and a polysilicon gate electrode 43B of the second MOS transistor, via respective gate insulation films 42A and 42B.

Further, in the silicon substrate 41, there are formed LDD regions 41a and 41b of the p-type in correspondence to respective sidewalls of the gate electrode 43A and LDD regions 41c and 41d of p⁻-type are formed in correspondence to respective sidewalls of the gate electrode 43B by conducting an ion implantation process while using the gate electrodes 43A and 43B as a self-aligned mask. Because the first and second MOS transistors are formed commonly in the device region 41A, the LDD region 41b and the LDD region 41c are formed by the same p⁻-type diffusion region.

On the polysilicon gate electrodes 43A and 43B, there are formed silicide layers 44A and 44B, respectively, and there are further formed sidewall insulation films on the sidewall surfaces of the polysilicon gate electrode 43A and on the sidewall surfaces of the polysilicon gate electrode 43B, respectively.

Further, in the silicon substrate 41, the diffusion regions 41e and 41f of p⁺-type are formed at respective outer sides of the sidewall insulation films of the gate electrode 43A and diffusion regions 41g and 41h of p⁺-type are formed at respective outer sides of the sidewall insulation films of the gate electrode 43B, by conducting an ion implantation process that uses the gate electrodes 43A and 43B and the respective sidewall insulation films as a self-aligned mask. Thereby, it should be noted that the diffusion regions 41f and 41g are formed of the same p⁺-type diffusion region.

Figure 6B:
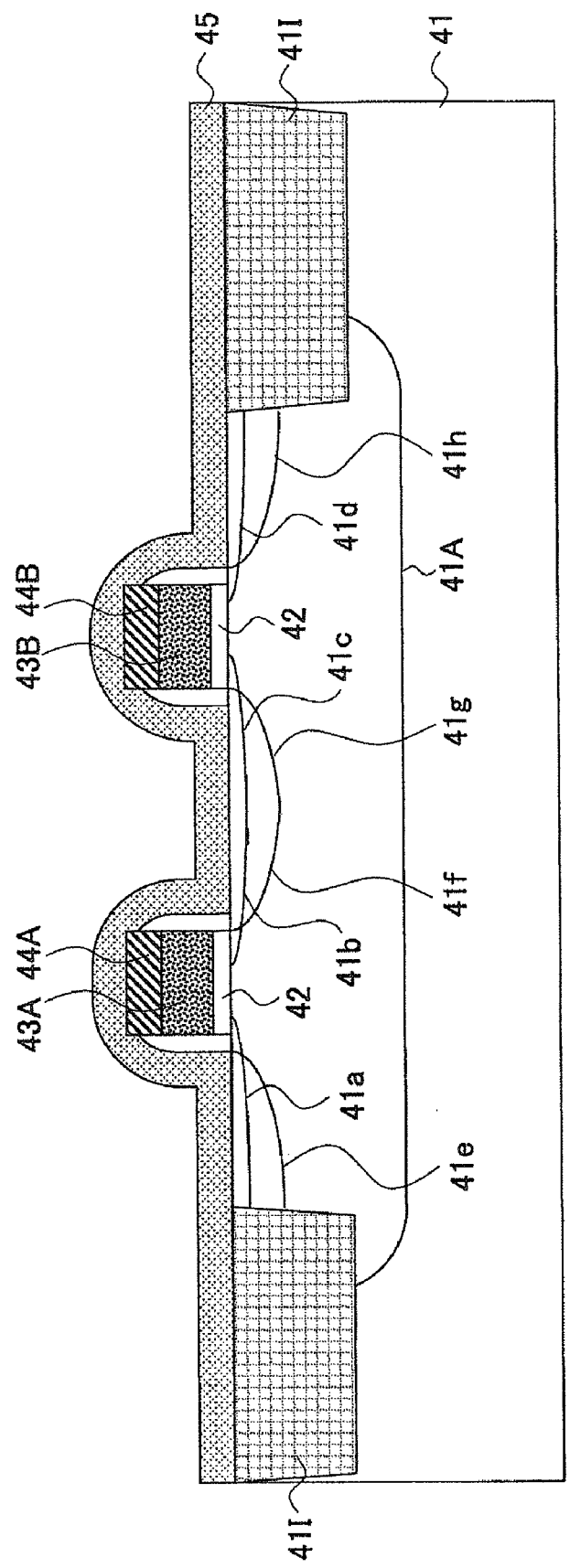

Next, in the step of FIG. 6B, an SiON film 45 is formed on the structure of FIG. 6A by a plasma CVD process with a thickness of about 200 nm.

Figure 6C:
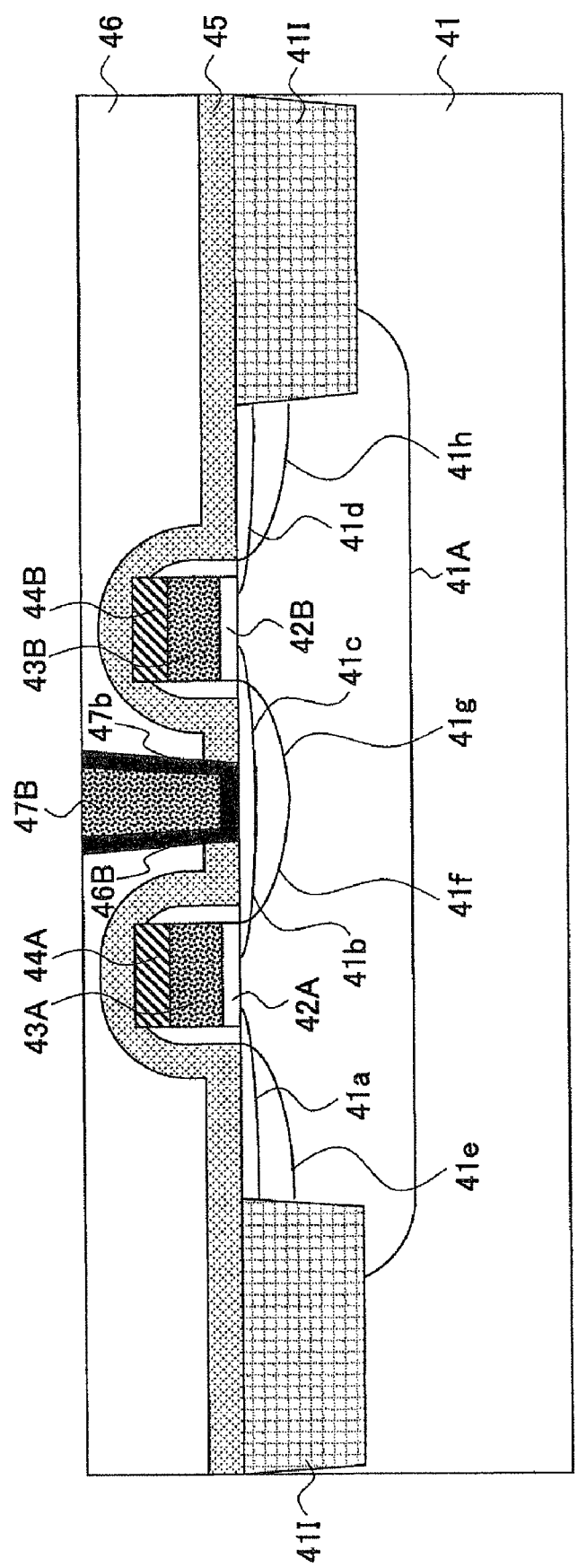

Next, in the step of FIG. 6C, a silicon oxide film having a thickness of 20 nm, a silicon nitride film having a thickness of 80 nm and a silicon oxide film having a thickness of 1000 nm are deposited consecutively on the structure of FIG. 6B by a plasma CVD process, and the structure thus formed is further planarized by a CMP process such that the interlayer insulation film 46 has a thickness of 700 nm.

Further, in the step of FIG. 6C, the interlayer insulation film 46 is formed with the contact hole 46B having a diameter of 0.25 μm, for example, so as to expose the diffusion region 41f (41g), and the contact hole 46B is formed with the W plug 47B so as to make electrical contact with the diffusion region 41f (41g), wherein the W plug 47B is formed by filling the contact hole 46B with a W film by conducting a CVD via an adhesion film 47b in which a Ti film having the thickness of 30 nm and a TiN film having the thickness of 20 nm are laminated. Thereafter, a CMP process is conducted for removing excessive W film.

Figure 6D:
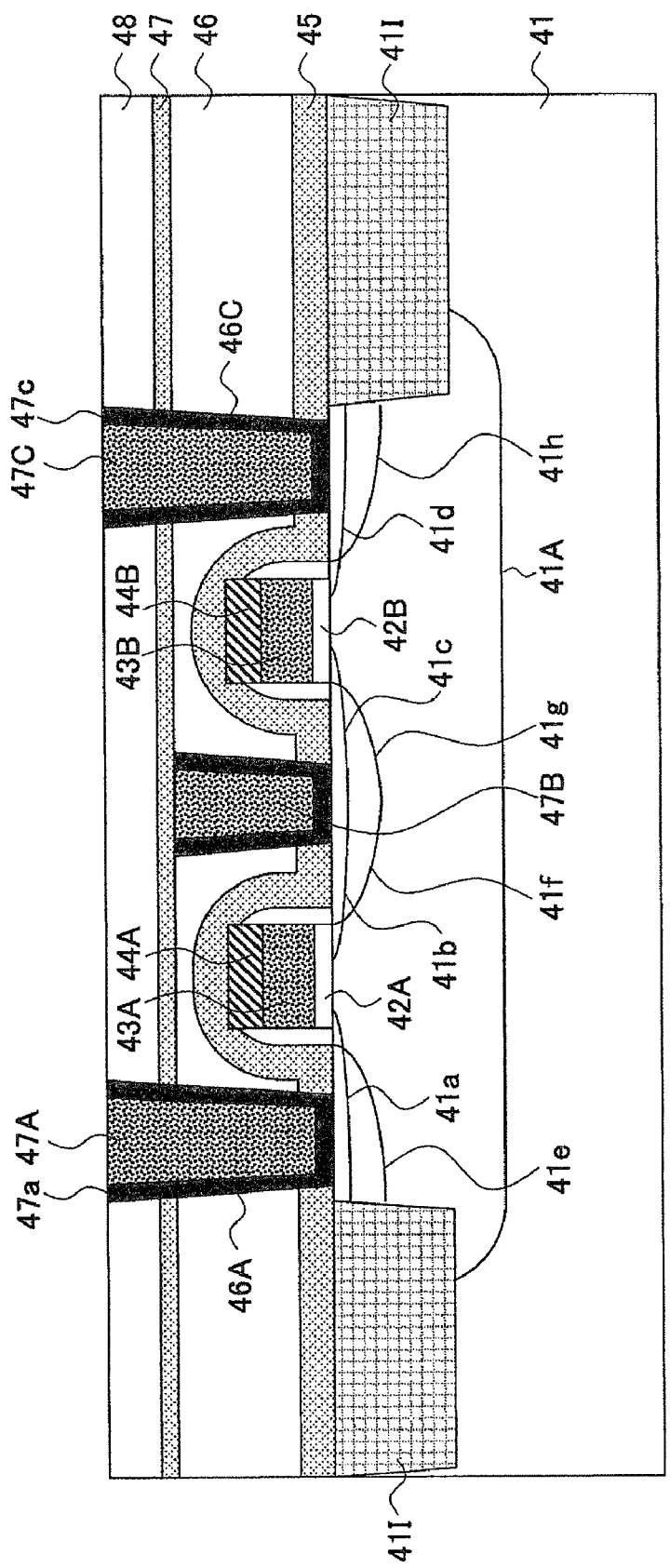

Next in the step of FIG. 6D, the first antioxidation film 47 of SiON is formed on the structure of FIG. 6C by a plasma CVD process with the film thickness of 130 nm, for example, and the silicon oxide film 48 is formed further thereon by a plasma CVD process that uses TEOS as the source material with the film thickness of 200 nm, for example.

Further, in the structure of FIG. 6D, the contact holes 46A and 46C are formed so as to penetrate through the interlayer insulation films 48 and 46 and the SiON film 47 such that the diffusion regions 41e and 41h are exposed, and the W plug 47A is formed in the contact hole 46A in electrical contact with the diffusion region 41e via the adhesive layer 47a similar to the adhesive layer 47b, as in the case of the W plug 47B. Further, the W plug 47C is formed in the contact hole 46C in electrical contact with the diffusion region 41h via the adhesive layer 47c similarly to the adhesive layer 47b, as in the case of the W plug 47B.

Now, the present embodiment shields, when forming the ferroelectric capacitors Q1 and Q2 on the structure of FIG. 6D, the influence of the crystal orientation of the W plugs 47A and 47C exerted to the ferroelectric capacitors Q1 and Q2 by conducting the process of FIGS. 6E-6H.

Figure 6F:
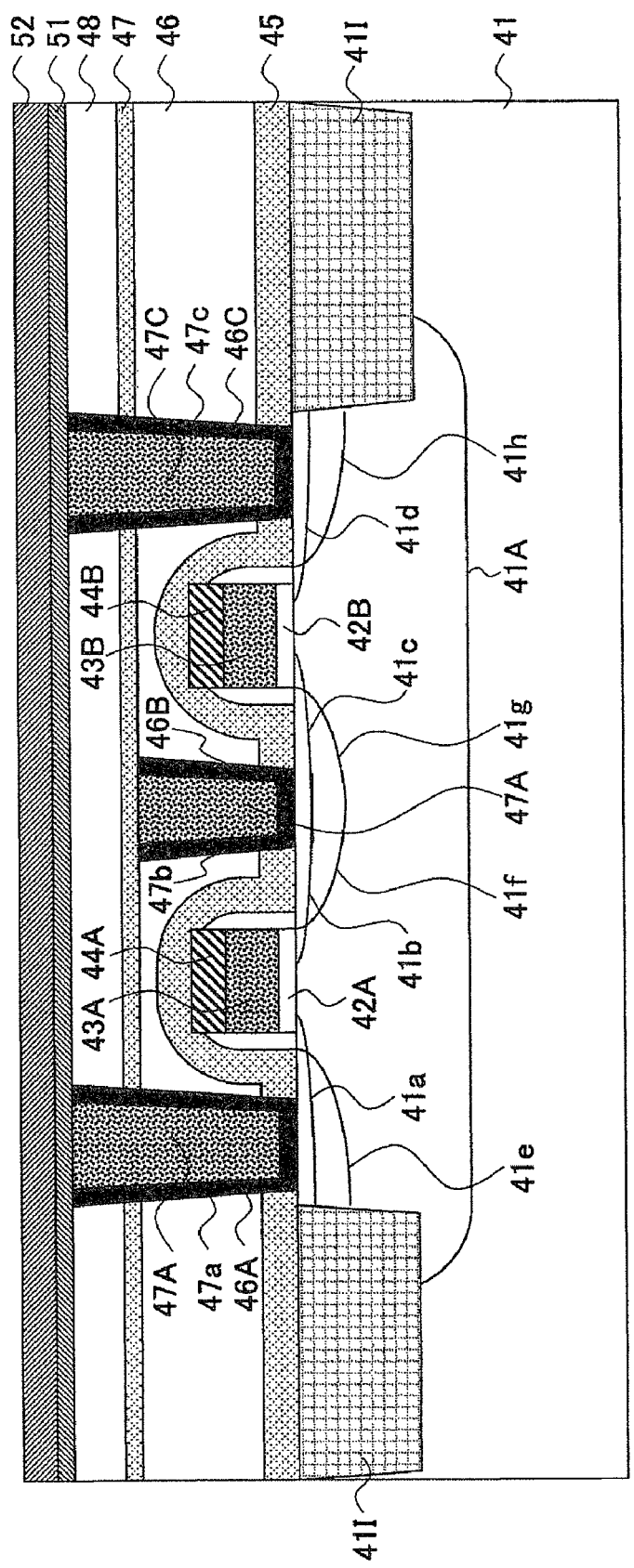

Thus, in the step of FIG. 6E, there is formed a Ti film 51 on the interlayer insulation film 48 of FIG. 6D by a sputtering process with a thickness of about 20 nm, and a TiAlN film is formed in the step of FIG. 6F on the structure of FIG. 6E by a reactive sputtering process as an oxygen barrier film 52 with a thickness of 100 nm while using an alloy target of Ti and Al in a mixed ambient of Ar 40 SCCM and nitrogen 100 SCCM under the pressure of 253.3 Pa (1.9 Torr) at the substrate temperature of 400° C. while supplying a sputter power of 1.0 kW. Further, an Ir film is formed on the TiAlN film 52 as a second electrode film with a thickness of 100 nm in an Ar ambient under the pressure of 0.11 Pa at the substrate temperature of 500° C. while supplying a sputter power of 0.5 kW.

Figure 6G:
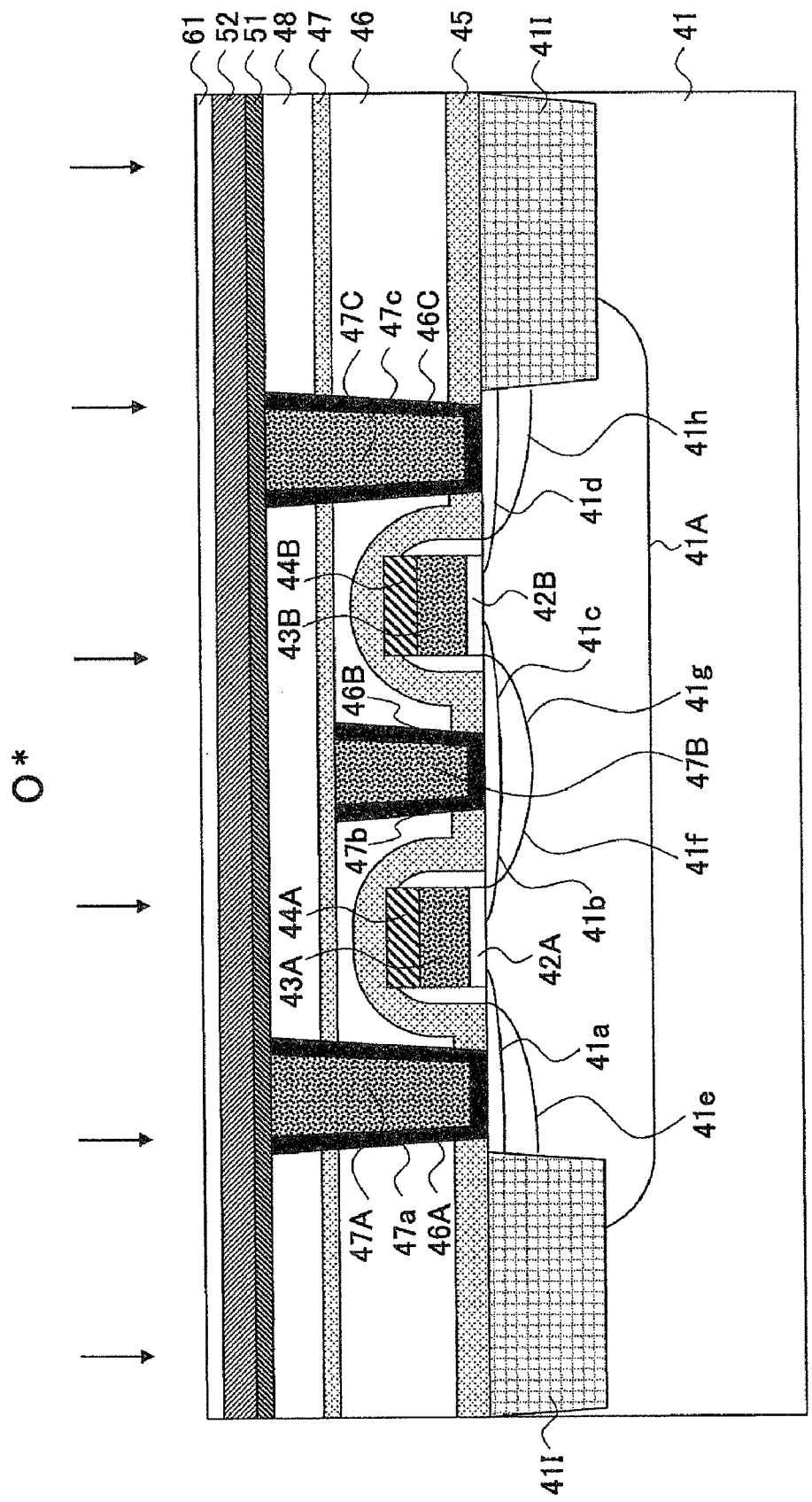
Figure 7:
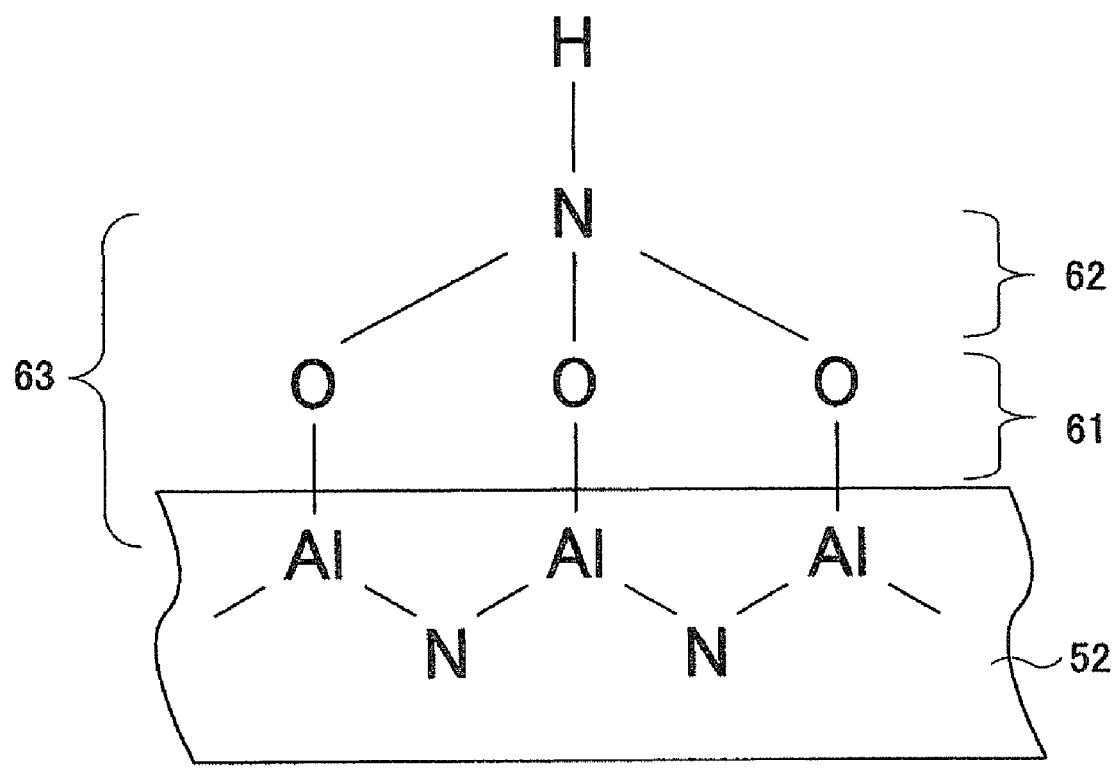
FIG. 7 is a diagram explaining the process of FIGS. 6G and 6H.

Next, in the step of FIG. 6G, there is formed an aluminum oxide film 61 on the surface of the TiAlN film 52 of FIG. 6F as shown in FIG. 7 with a thickness of 1 molecular layer or several molecular layers.

For example, the oxygen plasma processing of FIG. 6G may be conducted, in the case of an eight-inch process, by using a parallel plate plasma processing apparatus under the pressure of 0.67 Pa (5 Torr) while supplying an Ar gas with a flow rate of 500 SCCM and oxygen gas with a flow rate of 100 SCCM and exciting plasma with a high-frequency power of 750 W. In the case of a six-inch process, the similar processing can be achieved by exciting the plasma with a high-frequency power of 500 W. Otherwise, the process condition is set similar to the case of the eight-inch process noted above.

As a result of such plasma processing of the TiAlN film 52, there is formed an oxide film containing at least one oxygen atomic layer with a thickness of one to several molecular layers as a result of bonding of the plasma-excited oxygen radicals upon the Al atoms on the surface of the TiAlN film 52 as schematically represented in FIG. 7.

Because such aluminum oxide film 61 tends to cause to increase of contact resistance of the contact plugs 58A and 58C to be formed later, it is preferable to form the aluminum oxide film 61 to have a film thickness of 10 nm or less, such that tunneling of electrons is possible.

The oxygen plasma processing of the TiAlN film 52 is not limited to the plasma processing apparatus of parallel-plate type, but it is also possible to use a remote plasma processing apparatus that forms plasma-excited oxygen radicals outside of the processing vessel and supplies the oxygen radicals thus excited to a processing space at the surface of the substrate to be processed.

Thereby, the crystal orientation of the conductive plugs 47A and 47C can be satisfactorily screened by merely covering the surface of the TiAlN film 52 by at least one molecular layer of aluminum oxide or at least one atomic layer of oxygen.

Figure 6H:
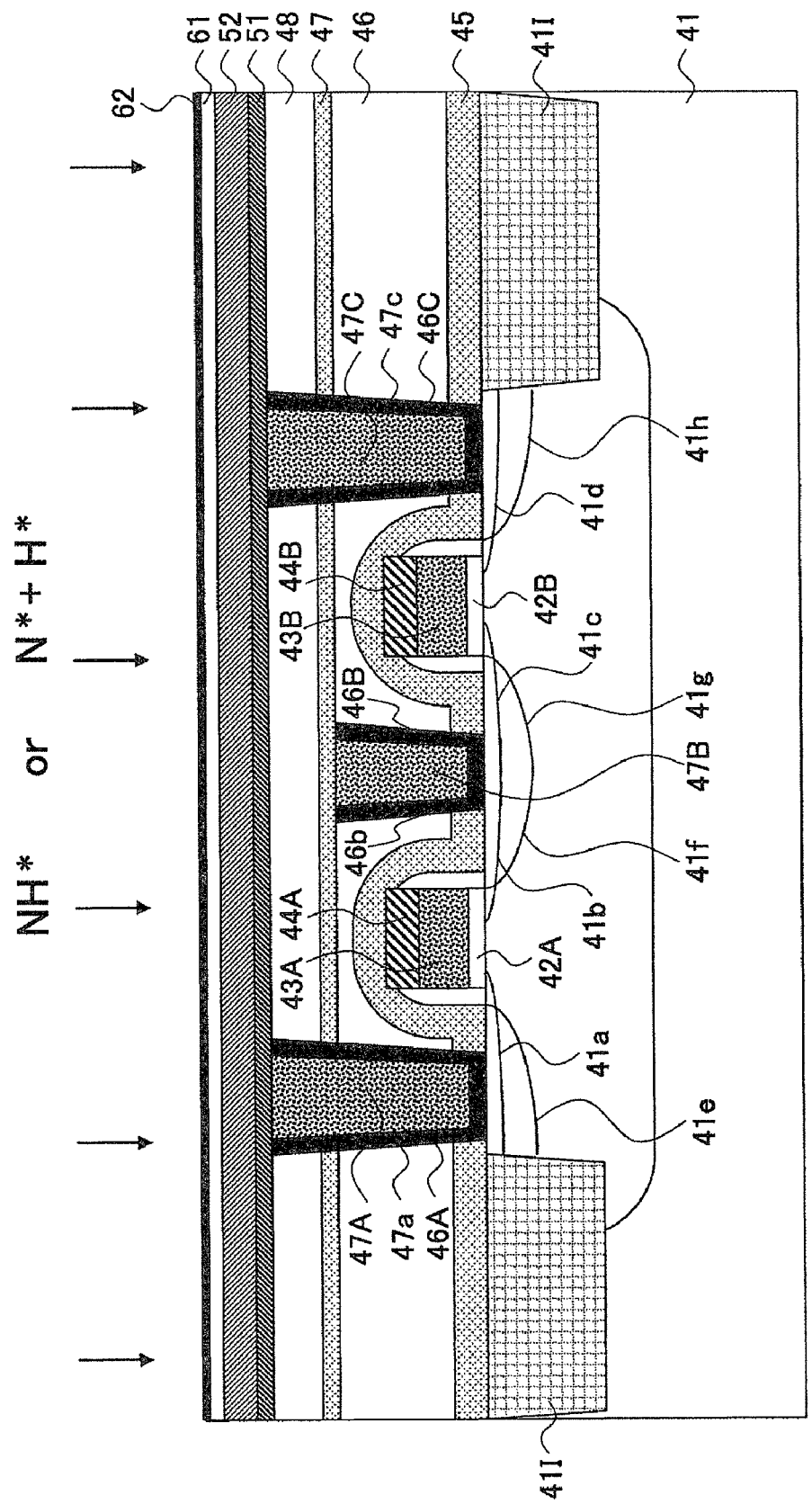

Next, in the present embodiment, ammoniac ($NH_3$) plasma is applied to the structure of FIG. 6G in the step of FIG. 6H so as to cause plasma nitridation at the surface of the aluminum oxide film 61, and there is formed a nitride film 62 that forms a hydrogen terminated bond of Al—O—N—H as explained previously with reference to FIG. 7.

Such ammonia plasma processing can be conducted, in the case of a six-inch process, in a plasma proceeding apparatus of parallel-plate type having an opposing electrode opposing the substrate to be processed with a distance of about 9 mm (350 mils) under the pressure of 266 Pa (2 Torr) while supplying an ammonia gas to the processing vessel in which the structure of FIG. 6G is held at the substrate temperature of 400° C. with a flow rate of 350 SCCM and supplying a high frequency power of 13.53 MHz frequency to the substrate to be processed with the power of 100 W and a high frequency power of 350 kHz frequency to the opposing electrode with the power of 55 W for 60 seconds. With such an ammonia plasma processing, there are formed NH radicals in the plasma, while the NH radicals thus formed act upon the surface of the nitride film 49, and the nitride film 50 explained before is formed on the surface of the oxide film 49 in the state terminated with hydrogen. It is sufficient that such a nitride film 50 covers the surface of the underlying oxide film 49 with one atomic layer of nitrogen. In the case of the eight-inch process, it is preferable to supply the high-frequency power of 13.56 MHz with the power of 400 W and carry out the processing for 180 seconds while setting the $NH_3$ flow rate to 525 SCCM and setting the substrate to the substrate to 400 mils.

Alternatively, it is possible to supply a nitrogen gas and a hydrogen gas separately into such a plasma processing apparatus and process the surface of the oxide film 49 by the nitrogen radicals and hydrogen radicals.

Further, the nitridation processing of FIG. 6H is not limited to such a parallel plate plasma processing apparatus but may be conducted by a remote plasma processing apparatus, for example.

In the case such lamination of the aluminum oxide film 61 and the nitride film 62 thereof takes place in such an atomic layer scale, the resultant lamination structure of the oxide film and the nitride film constitutes as a whole an AlON film 63 enriched with oxygen at the bottom part and enriched with nitrogen at the top part.

Figure 6I:
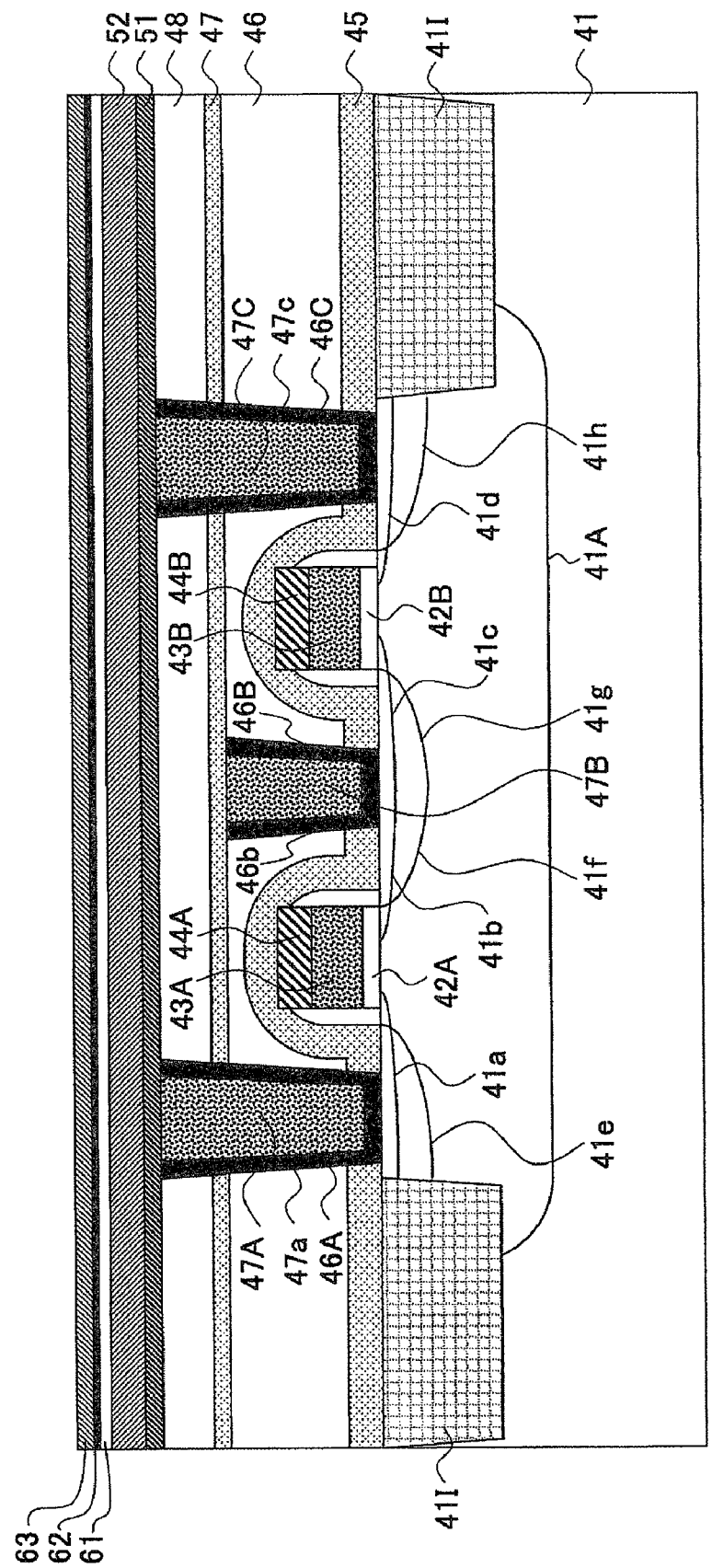

Next, in the step of FIG. 6I, a Ti film 63 is deposited on the nitride film 62 of FIG. 6H by a low temperature process such as a sputtering process with a thickness of about 20 nm such that the O—N bond between the oxide film 61 and the nitride film 62 is not cleaved.

For example, sputtering of such a Ti film 63 can be conducted, in the case of a six-inch process, in a sputtering apparatus in which the distance between the substrate to be processed and the target is set to 60 mm, under the Ar ambient of 0.15 Pa pressure at the substrate temperature of 20° C. while supplying a sputter D.C. power of 2.6 kW for 7 seconds. Further, in the case of the eight-inch process, it is possible to carry out the processing in a sputtering apparatus in which the distance between the substrate to be processed and the target is set to 60 mm, under the pressure of 1 Pa at the substrate temperature of 150° C. while supplying the Ar gas with 50 SCCM. There, an initial film formation is conducted for one second with the power of 0.5 kW, followed by the remaining film formation conducted with the power of 1.42 kW for 13 seconds.

Figure 8:
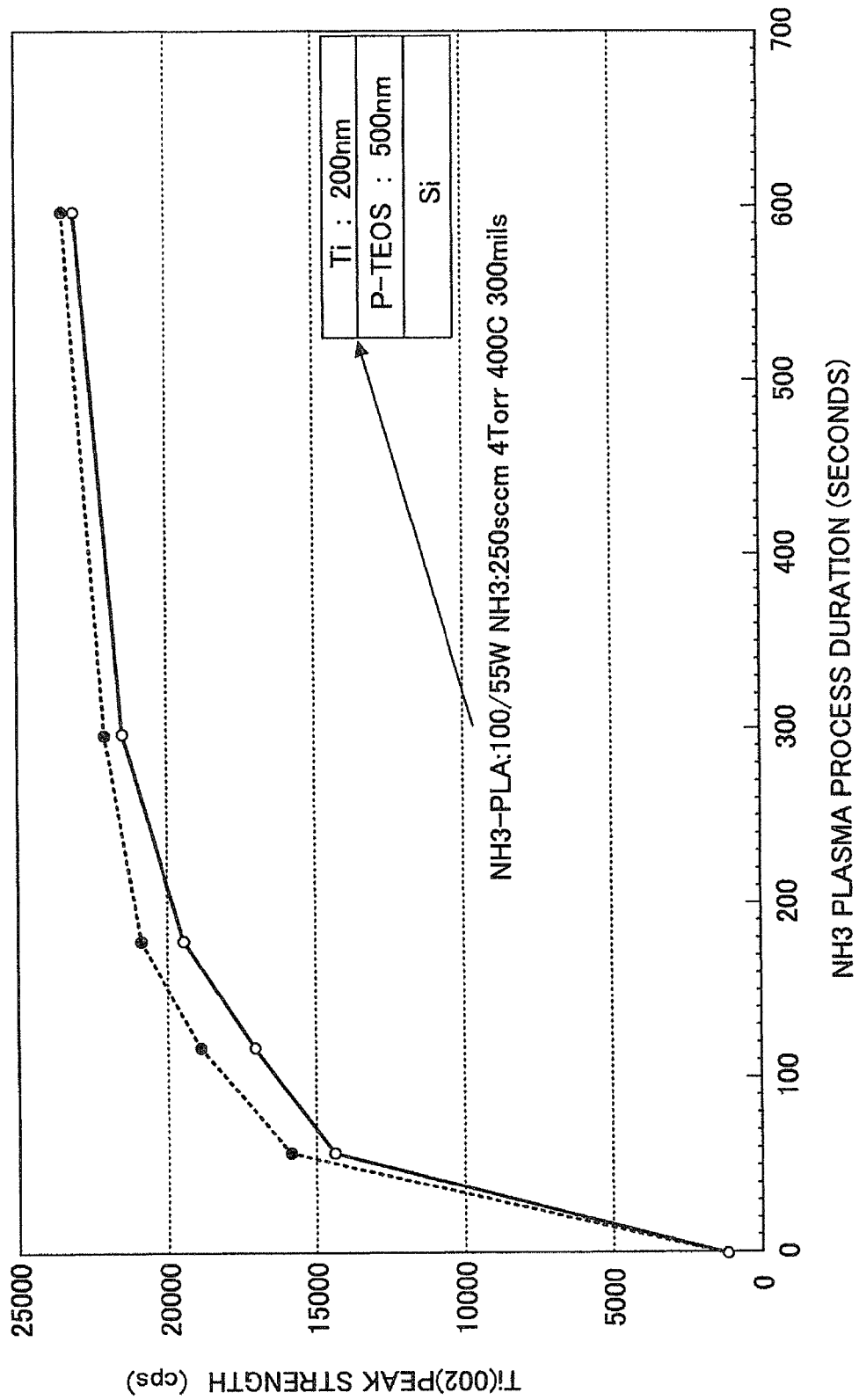
FIG. 8 is a diagram showing the orientation of the Ti film formed with the process of FIG. 6I.

FIG. 8 shows the relationship between the diffraction strength of the (002) peak of the Ti film formed on the silicon oxide film, which has been subjected to the ammonia plasma nitride processing explained before, and the duration of the nitridation processing. It should be noted that this experiments has been conducted by first applying plasma nitridation to a surface of a plasma TEOS film formed on a silicon substrate with a thickness of 500 nm under the condition explained before and further sputtering the Ti film on the surface of the TEOS film thus subjected to the plasma nitridation processing.

Referring to FIG. 8, it can be seen that in the case the ammonia plasma processing time is zero, there is observed a very weak peak for the Ti(002) diffraction, while the intensity of the Ti(002) diffraction increases with increasing time of the ammonia plasma processing, indicating that the degree of (002) orientation of the Ti film is increased. In the ammonia plasma nitridation processing explained previously with reference to FIG. 6H, the nitridation processing has been conducted for 60 seconds, while FIG. 8 indicates that a larger degree of (002) orientation is attained for the Ti film 63 when the duration of the nitridation processing in the step of FIG. 6H is increased before forming the Ti film 51. On the other hand, the rate of increase of the (002) orientation starts to decrease when the processing duration exceeds 60 seconds.

Thus, a Ti film formed on a nitride film shows a strong (002) orientation, while this implies that the Ti atoms deposited on the nitride film 62 covering the aluminum oxide film 61 underneath can migrate relatively freely over the surface of the nitride film without being captured by the oxygen atoms at the surface of the oxide film.

In the structure of FIG. 6I, too, the Ti film 63 formed on the nitride film 62 shows a strong (002) orientation, while it should be noted that, in the present embodiment, the nitride film 62 is not only formed on the interlayer insulation film 48 but also on part of the TiAlN film 52 covering the conductive plugs 47A and 47C, and thus, the Ti film 63 shows the strong (002) orientation also in the part over the conductive plugs 47A and 47C. Because the aluminum oxide film 61 exists between the nitride film 62 and the TiAlN film 52, there is caused no influence upon the (002) orientation of the Ti film 63 by the orientation of the crystal grains constituting the conductive plug 47A or 47C via the TiAlN film 52.

In the step of FIG. 6I, it should be noted that the deposition of the Ti film 63 is conducted at the temperature of 300° C. or less, such as the temperature of 20° C. Thus, there occurs no decoupling of the nitrogen atoms constituting the nitride film 62 at the time of deposition of the Ti film 63.

Figure 6J:
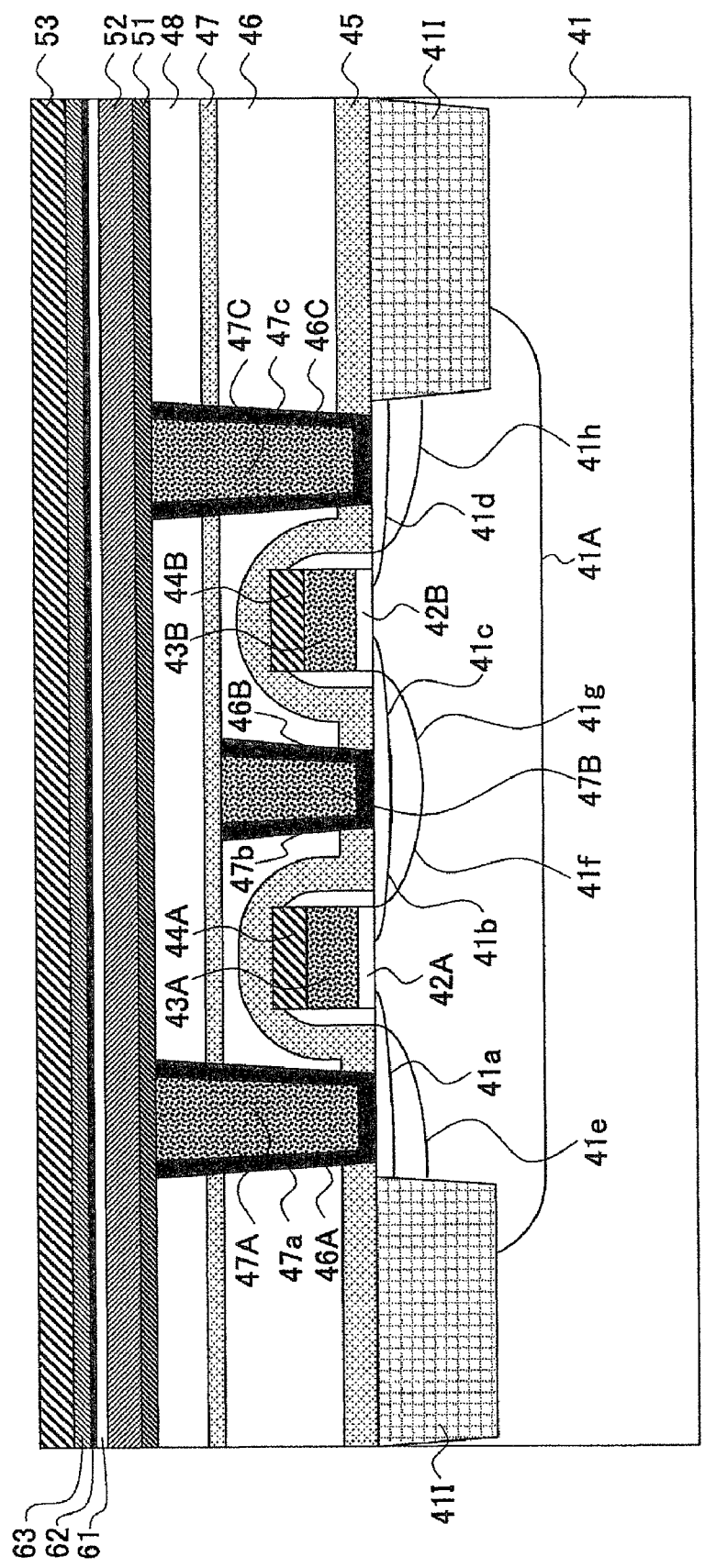

Next, in the step of FIG. 6J, there is formed an Ir film 53 on the structure of FIG. 6H as a second lower electrode in an Ar ambient under the pressure of 0.11 Pa at the substrate temperature of 500° C. for the thickness of 100 nm while using a sputtering power of 0.5 kW.

It should be noted that it is also possible to use a metal of platinum group such as Pt, or even a conductive oxide such as PtO, $IrO_x$, $SrRuO_3$, or the like, in place of the Ir film 53. Further, it is also possible to use a laminated film of the foregoing metals or metal oxides for the lower electrode 53.

Figure 6K:
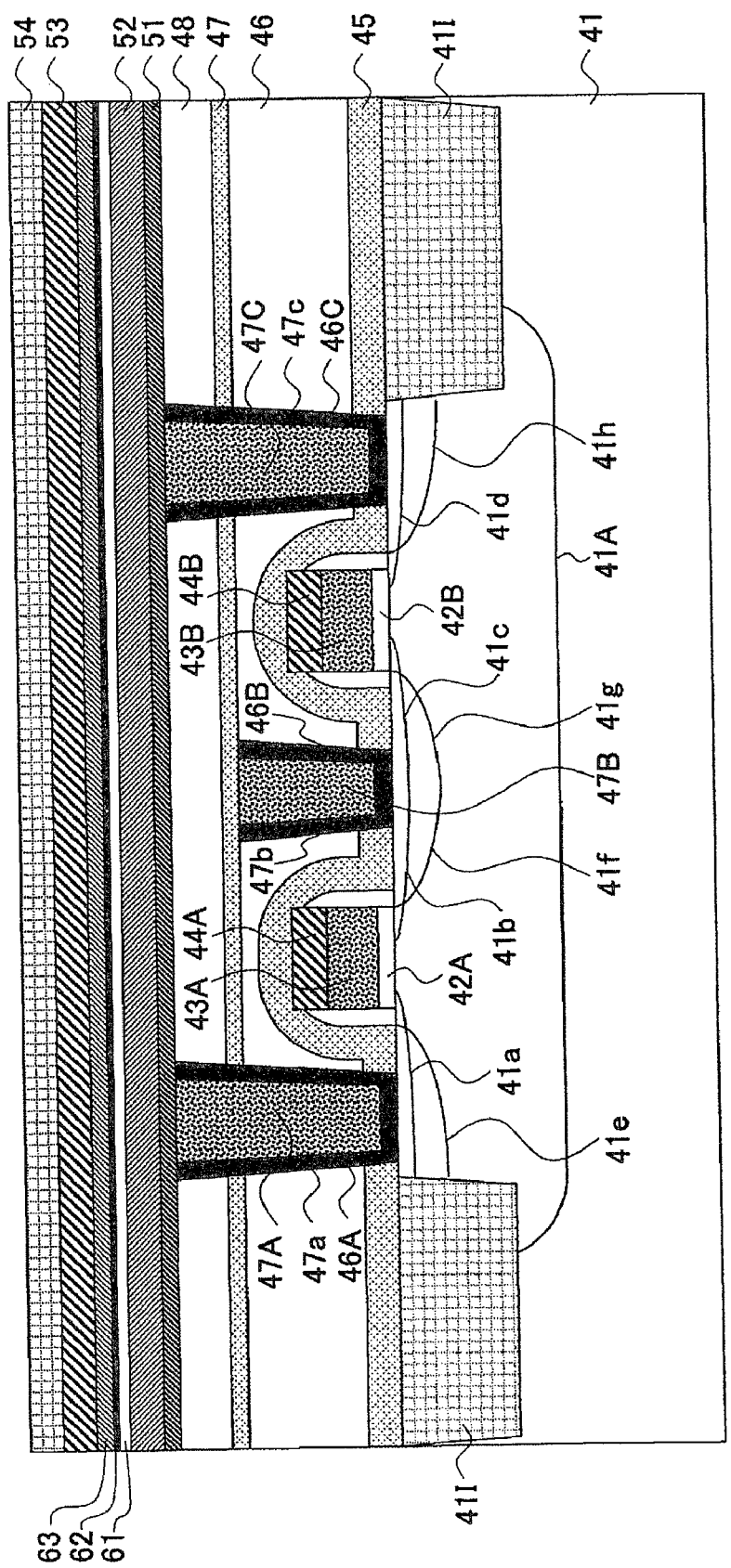

Next, in the step of FIG. 6K, a PZT film is formed on the structure of FIG. 6J as a ferroelectric film 54 by an MOCVD process.

More specifically, $Pb(DPM)_2$, $Zr(dmhd)_4$ and $Ti(O\text{-}iOr)_2$ $(DPM)_2$ are dissolved in a THF solvent with a concentration of 0.3 mol/l for each, and liquid sources of Pb, Zr and Ti are prepared. By supplying these liquid sources to the vaporizer of the MOCVD apparatus with respective flow rages of 0.326 ml/minute, 0.200 ml/minute and 0.200 ml/minute together with a THF solvent supplied with the flow rage of 0.474 ml/minute for evaporation, the source gases of Pb, Zr and Ti are formed.

Further, in the step of FIG. 6K, the structure of FIG. 6J is held in the MOCVD apparatus under the pressure of 665 Pa (5 Torr) at the substrate temperature of 620° C., and the source gases of Pb, Zr and Ti are supplied to the structure of FIG. 6H in the MOCVD apparatus for the duration of 620 seconds. With this, the desired PZT film 54 is formed on the lower electrode layer 53 with a thickness of 120 nm.

Figure 6L:
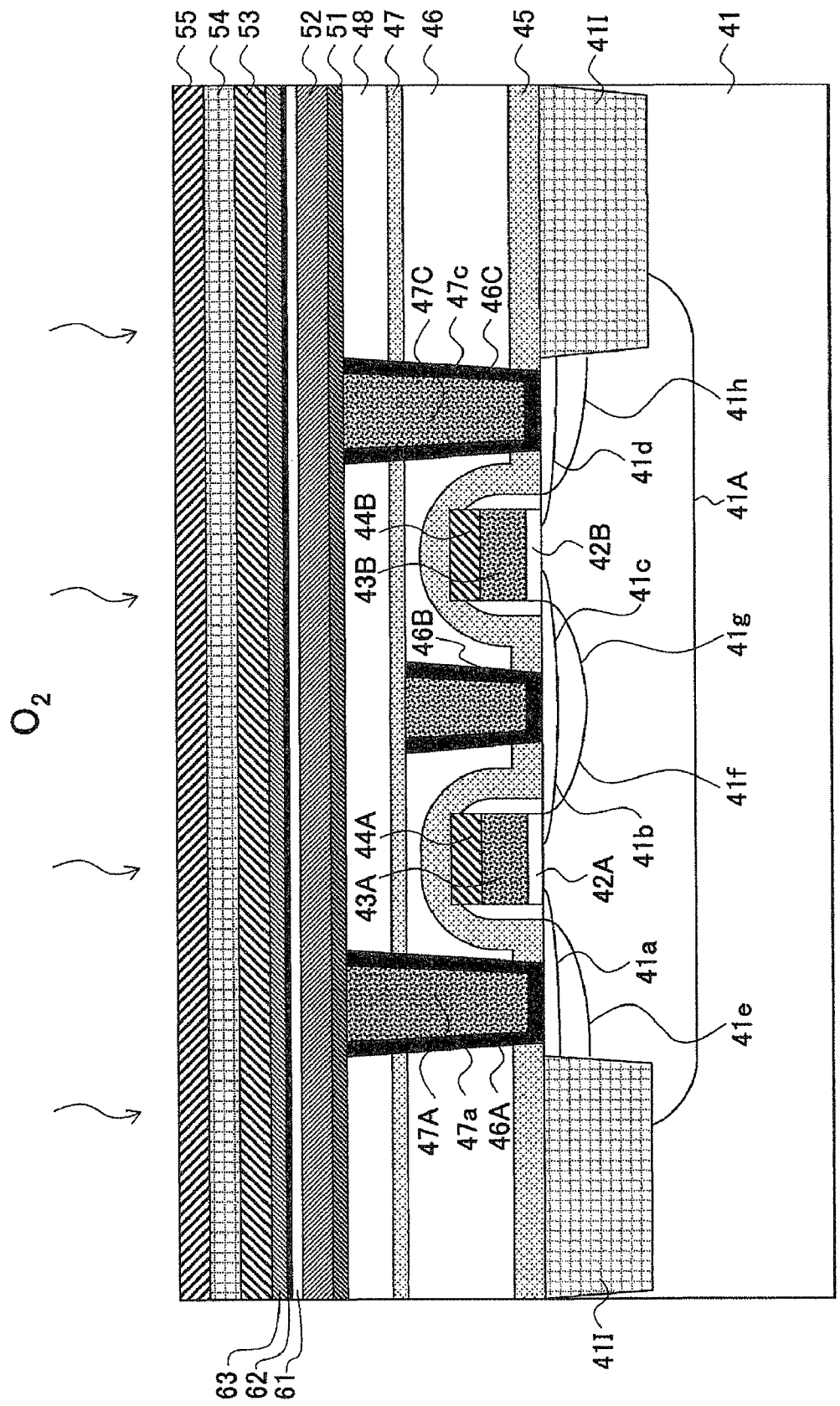

Next, in the step of FIG. 6L, the structure of FIG. 6K is held at the room temperature, and an iridium oxide film 55 is sputtered thereon with a thickness of 200 nm in an Ar ambient under the pressure of 0.8 Pa by using the sputter power of 1.0 kW for 79 seconds. Further, the structure thus obtained is annealed in an oxygen ambient at the substrate temperature of 550° C. for 260 seconds such that the PZT film 54 is crystallized. Thereby, oxygen defects in the PZT film 54 are compensated. Here, it should be noted that the iridium oxide film 55 has a composition near the stoichiometric composition of $IrO_2$. Thus, there is caused no catalysis action to hydrogen, and the problem that the ferroelectric film 54 is reduced by the hydrogen radicals is successfully suppressed. Thereby, the resistance of the capacitors Q1 and Q2 against hydrogen is improved.

Figure 6M:
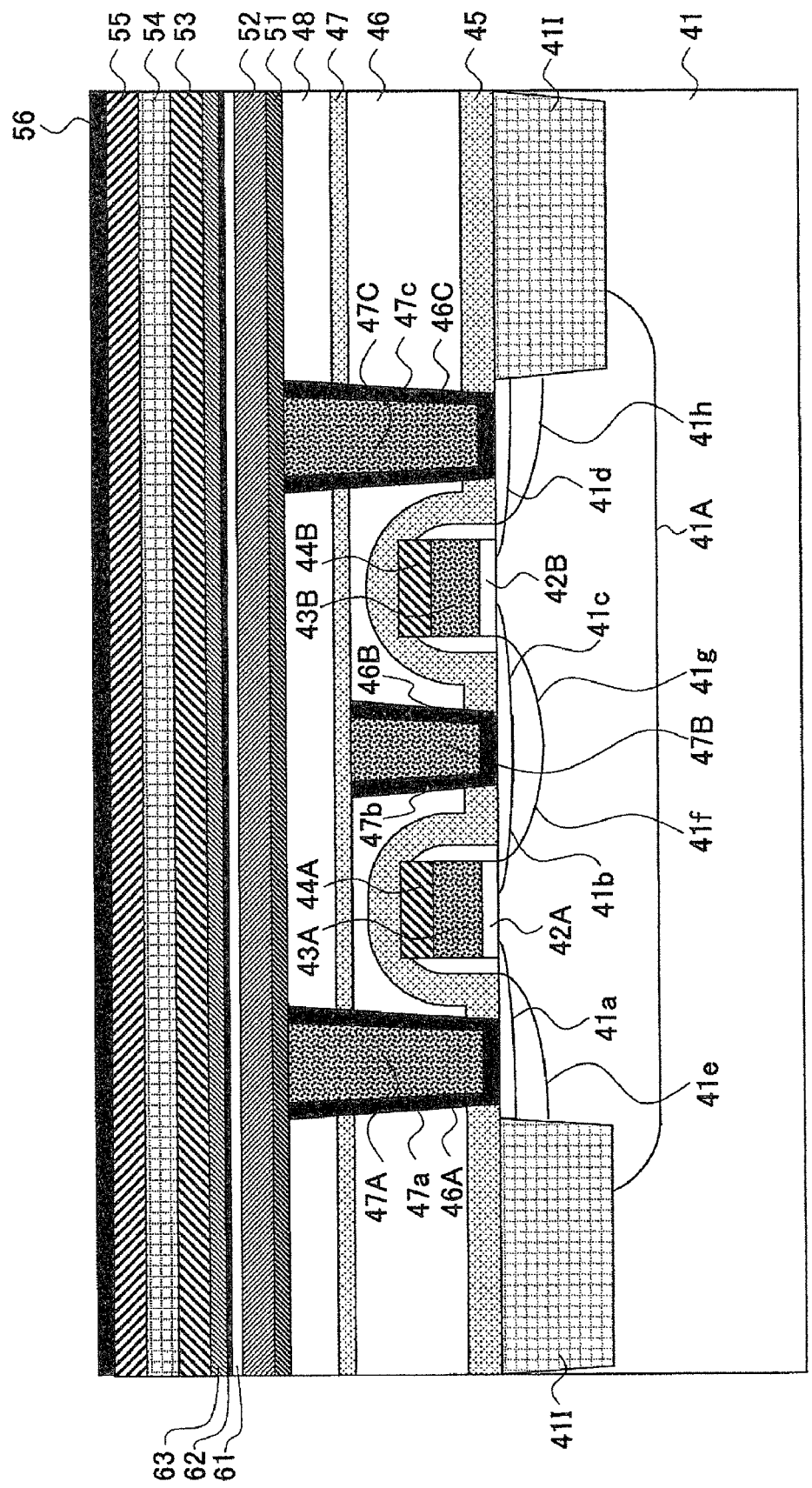

Further, in the step of FIG. 6M, an Ir film 56 is deposited on the structure of FIG. 6L with a thickness of 100 nm as a hydrogen barrier film by a sputtering process conducted in an Ar ambient under the pressure of 1 Pa while using a sputter power of 1.0 kw. Thereby, it should be noted that it is also possible to use a Pt film or $SrRuO_3$ film for the hydrogen barrier film 56.

Figure 6N:
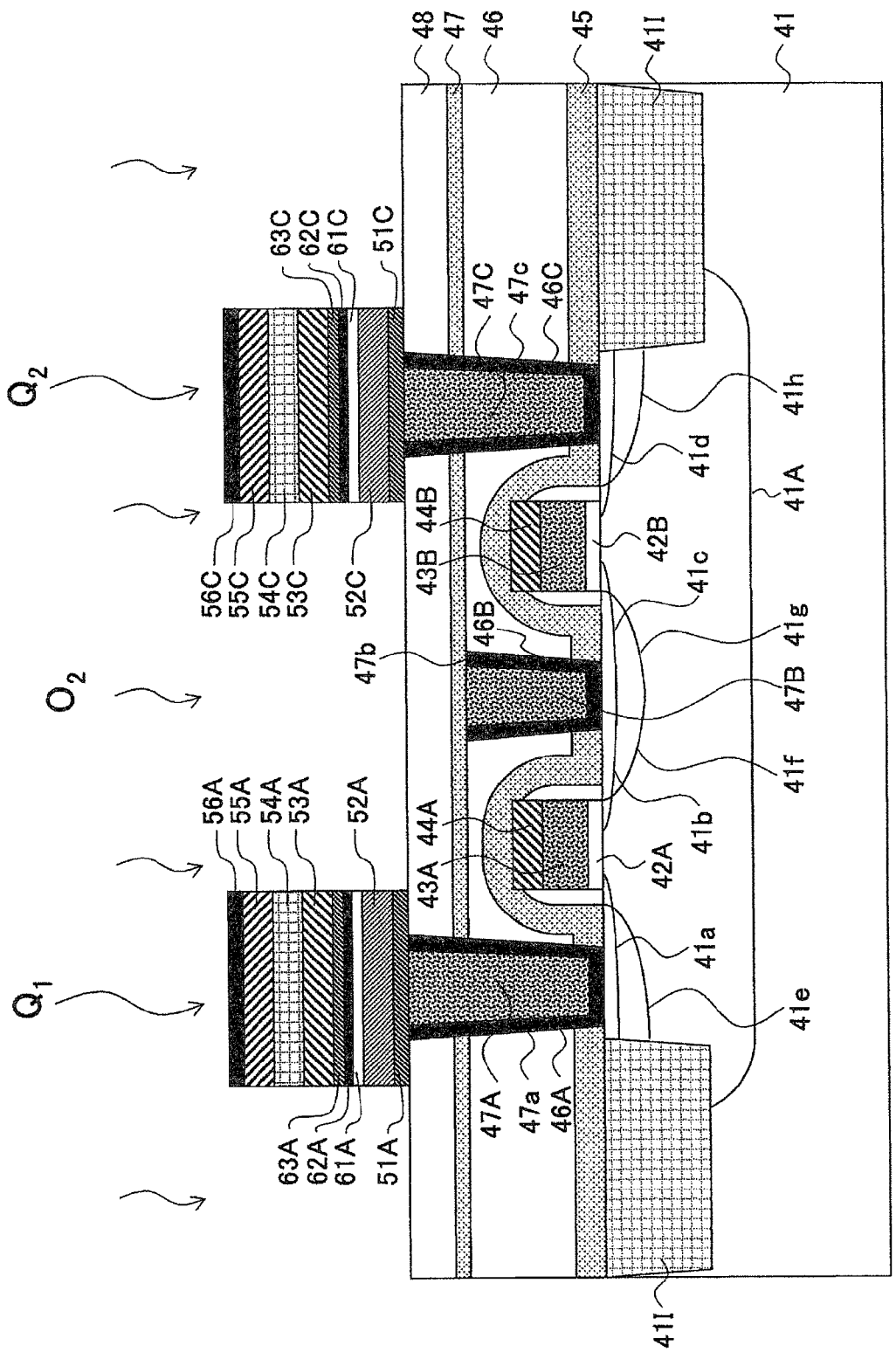

Further, in the step of FIG. 6N, the layers 51-56 and 61-63 are pattered, and with this, the ferroelectric capacitor Q1 and the ferroelectric capacitor Q2 are formed.

Further, in the step of FIG. 6N, the ferroelectric capacitors Q1 and Q2 thus formed are annealed in an oxygen ambient at the temperature of 550° C., and the oxygen defects formed in the PZT films 54A and 54C by the patterning process are recovered.

Next, in the step of FIG. 6O, an $Al_2O_3$ film is formed on the structure of FIG. 6N by a sputtering process initially with the thickness of 20 nm so as to cover the interlayer insulation film 48 and the ferroelectric capacitors Q1 and Q2, followed by a thermal annealing process conducted at 600° for recovering the oxygen defects formed in the ferroelectric capacitors Q1 and Q2 as a result of the foregoing patterning process. Thereafter, the $Al_2O_3$ film 57 is formed by a CVD process with a thickness of about 20 nm.

Further, after the step of FIG. 6O, the interlayer insulation film 58 shown in FIG. 5 is deposited on the $Al_2O_3$ film 57 by a high-density plasma CVD process so as to cover the ferroelectric capacitors Q1 and Q2, and after planarization process by a CMP process, the via-plugs 59A, 59B and 59C are formed respectively in contact with the upper electrode 56A of the ferroelectric capacitor Q1, the via-plug 47B and the upper electrode 56C of the ferroelectric capacitor Q2, via respective contact holes 58A, 58B and 58C. Thereby, it should be noted that the via-plugs 59A, 59B and 59C are formed respectively with adhesion layers 59a, 59b and 59c of the Ti/TiN structure.

While not illustrated, it should be noted that the contact holes 58A-58C are formed in the interlayer insulation film 58 by first forming the contact holes 58A and 58C to expose the hydrogen barrier film 56A and 56C covering the upper electrodes of the capacitors Q1 and Q2 and apply a thermal annealing process in an oxygen ambient at the substrate temperature of 550° C. such that any oxygen defects caused in the PZT films 54A and 54C at the time of formation of the contact holes 58A and 58C are recovered.

When forming the conductive plugs 59A, 59B and 59C in the contact holes 58A and 58C, it is preferable to form a TiN film on the surface of the contact holes 58A, 58B and 58C as the adhesion layers 59a, 59b and 59c, such that the TiN film alone is formed for the foregoing adhesion layers. Thereby, it is also possible to form the adhesion layers 59a, 59b and 59c by forming a Ti film by a sputtering process, followed by formation of a TiN film by an MOCVD process. In this approach, it becomes possible to carry out processing in a mixed gas plasma of nitrogen and hydrogen for removing carbon from the TiN film, while in the case of the present embodiment, in which there are formed hydrogen barrier films 56A and 56C on the upper electrodes 55A and 55C, there arises no problem that the upper electrode is reduced.

Further, the interconnection patterns 70A, 70B and 70C are formed on the interlayer insulation film 58 respectively in correspondence to the via-plugs 58A, 58B and 58C.

Figure 9:
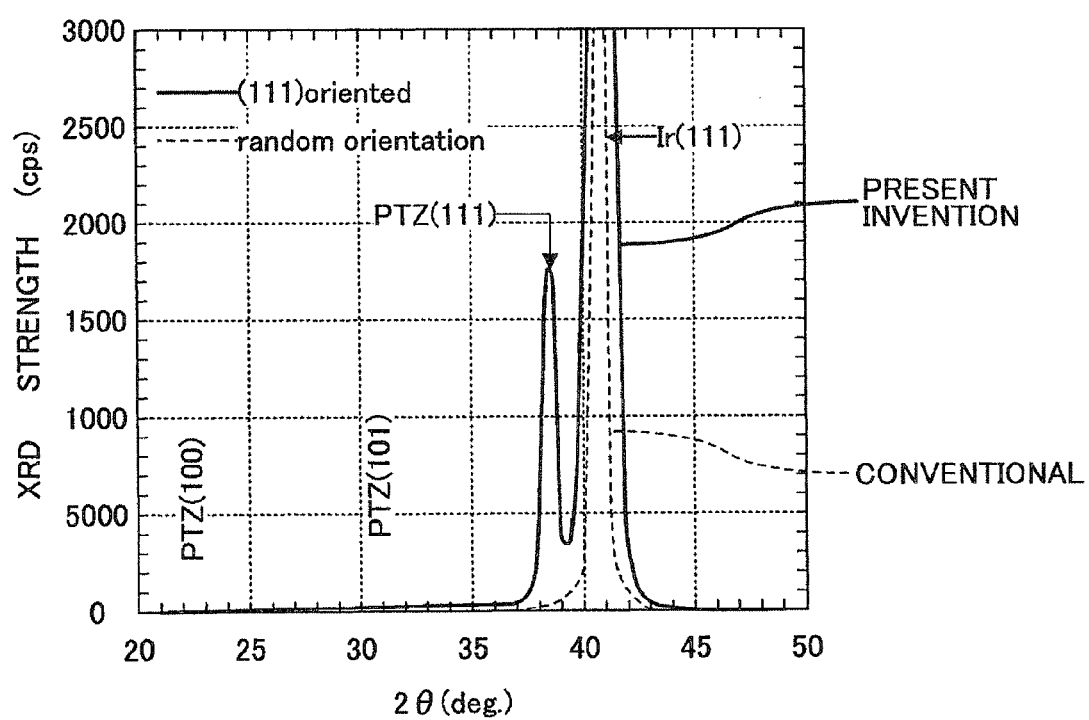
FIG. 9 is a diagram showing an X-ray diffraction pattern of the PZT film formed with the process of FIG. 6K.

FIG. 9 shows the X-ray diffraction pattern of the PZT film 54 thus formed.

Referring to FIG. 9, it can be seen that there is obtained a PZT film of substantially (111) orientation as the ferroelectric film 54A or 54B including the part directly over the conductive plugs 47A and 47B, in view of the observation of the strong (111) diffraction peak of PZT and no substantial observation of the diffraction peak of (100) or (101) surface of PZT, as a result of interposing the aluminum oxide film 61A and the nitride film 62A between the part of the TiAlN oxygen barrier film 52A corresponding to the conductive plug 47A and the Ti film 63A and as a result of interposing the aluminum oxide film 61C and the nitride film 62C between the part of the TiAlN oxygen barrier film 52C corresponding to the conductive plug 47C and the Ti film 63C.

Figure 10:
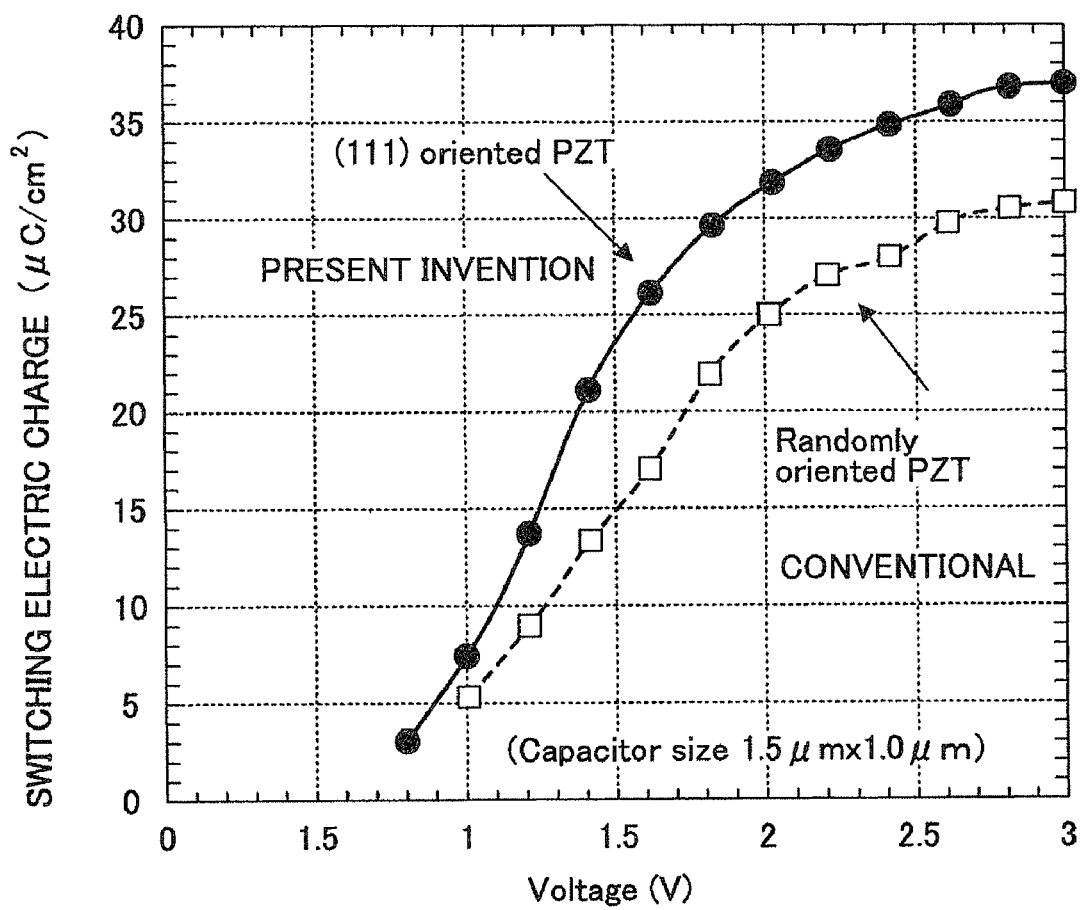
FIG. 10 is a diagram showing a switching electric charge of the ferroelectric capacitor used with the ferroelectric memory device of FIG. 5.

FIG. 10 shows the switching electric charge QSW of the PZT film having the (111) orientation in comparison with that of the PZT film of random orientation. There, it should be noted that the measurement of the switching electric charge QSW is conducted by forming a ferroelectric capacitor of the size of 1.5×1.0 μm².

Referring to FIG. 10, it can be seen that the switching electric charge Qsw increases significantly when the PZT film has the (111) orientation as compared with the PZT film of the random orientation.

Figure 11:
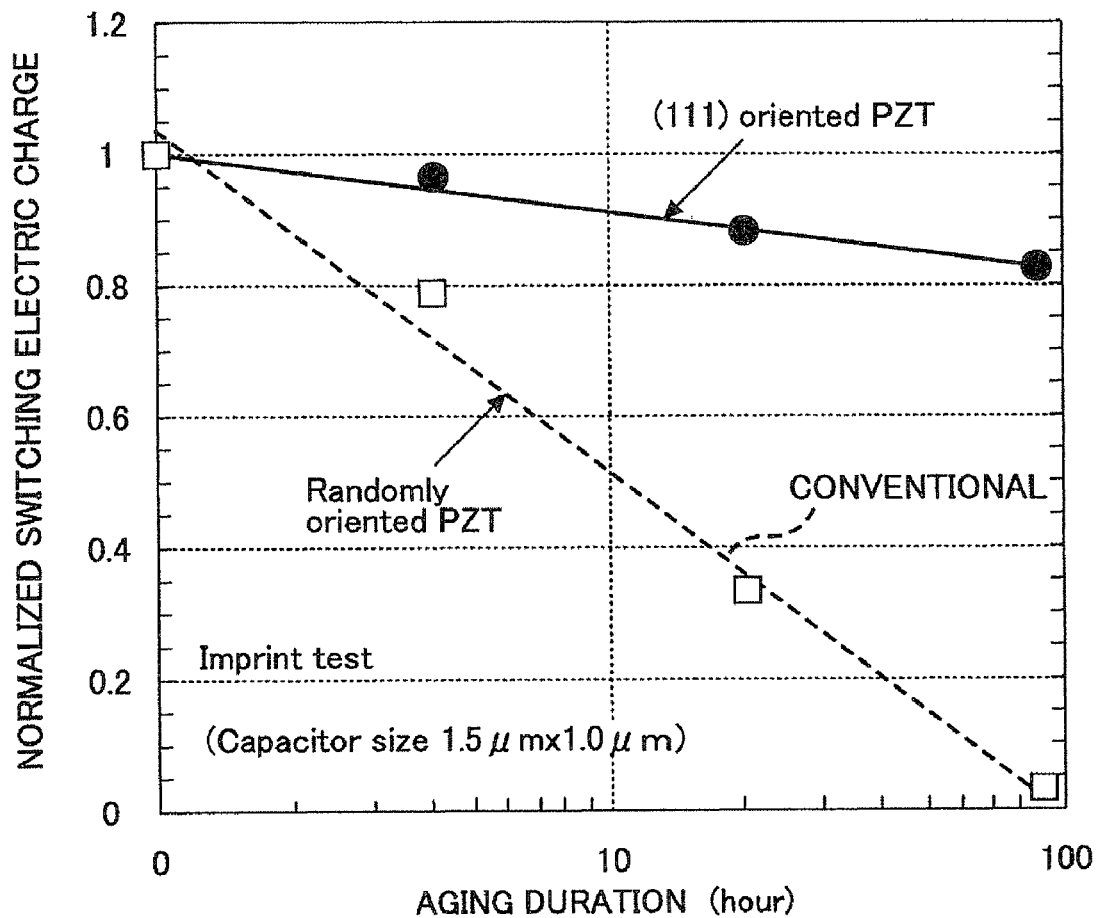
FIG. 11 is a diagram showing an imprint characteristic of the ferroelectric capacitor used with the ferroelectric memory device of FIG. 5.

FIG. 11 shows the imprint characteristics of the PZT film having the (111) orientation in comparison with that of the PZT film of random orientation. Again, it should be noted that the measurement of the imprint characteristics is conducted by forming a ferroelectric capacitor of the size of 1.5×1.0 μm².

Referring to FIG. 11, it can be seen that the switching electric charge $Q_{SW}$ of the PZT film of the (111) orientation does not show degradation of more than 20% even after duration of 100 hours has elapsed, while in the PZT film of the random orientation, it can be seen that the switching electric charge decreases steeply with time.

As noted before, the present embodiment achieves such improvement of electric characteristics by interposing the nitride film 62 in the step of FIG. 6H underneath the self-aligned Ti film 63 having the (002) orientation such that the Ti atoms in the Ti film 63 does not develop a firm bond with the oxygen atoms in the aluminum oxide film 61 underneath.

Figure 12:
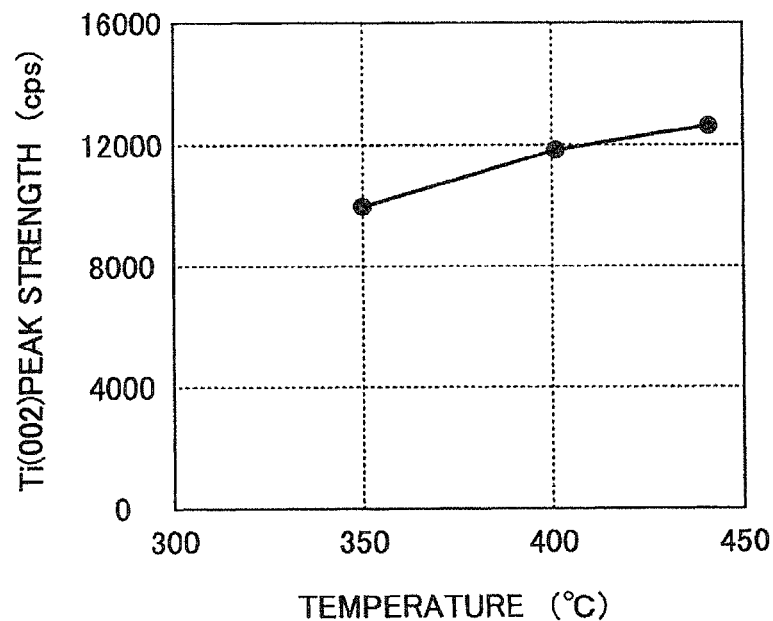
FIG. 12 is a diagram showing the processing condition of the process step of FIG. 6F.

Thereby, while the nitridation processing has been conducted in the step of FIG. 6H at the substrate temperature of 400° C., the present embodiment is not limited to such a specific temperature, and it will be noted that the nitridation processing can be conducted at the temperature of 350-450° C. as shown in FIG. 12.

Figure 13:
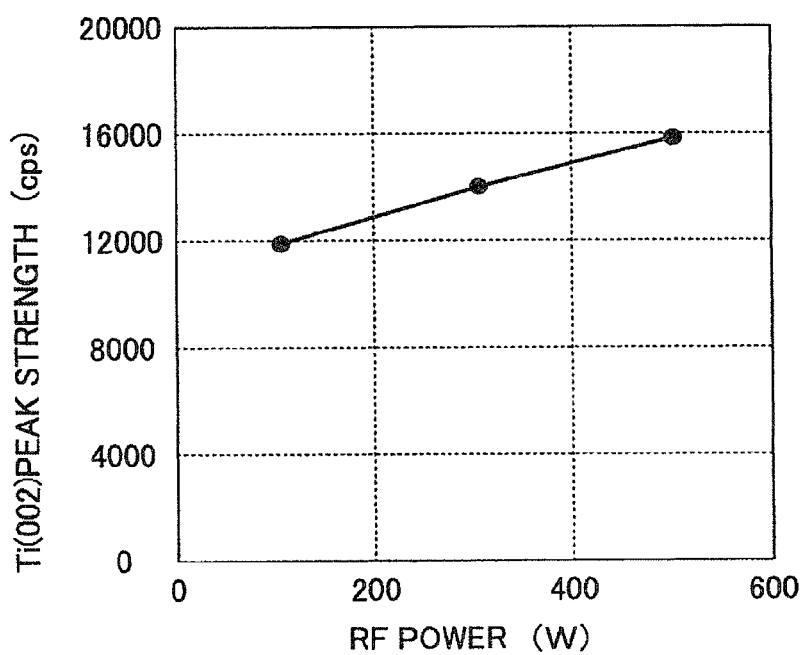
FIG. 13 is another diagram showing the processing condition of the process step of FIG. 6F.

Further, it is possible to change the plasma power at the time of the nitridation processing in the range of 100-500 W as shown in FIG. 13.

While explanation has been made in the preceding embodiments that the self alignment films 63A and 63C are formed of a Ti film, it is also possible to use other self-orientation films such as an Ir film, a Pt film, a PZT film, a $SrRuO_3$ film, a Ru film, a TiN film, a TiAlN film, a Cu film, an IrOx film, and the like.

Further, while explanation has been made in the preceding embodiments that the conductive plugs, 47A-47C and 59A-59C are W plugs, it is also possible to use polysilicon, Ti, TiN, TiAlN, Al, Cu, Ru, $SrRuO_3$, and the like, for the foregoing conductive plugs.

Further, while explanation has been made in each the preceding embodiments that the ferroelectric films 54A and 54C are formed of a PZT film, it is also possible to use the films of other PZT solid solution compositions such as a PLZT film. Further, it is also possible to use other perovskite films such as $BaTiO_3$, $(Bi_{1/2}Na_{1/2})TiO_3$, $KNbO_3$, $NaNbO_3$, $LiNbO_3$, and the like, for the ferroelectric films 54A and 54C.

Further, with the present embodiment, it is also possible to form the ferroelectric films 54A and 54B with a sputtering process.

Furthermore, the present embodiment is useful also for the production of the semiconductor devices having a functional film that utilizes crystal orientation, in addition to the ferroelectric memory device.

Further, while the present embodiment has been explained heretofore with regard to preferred embodiments, the present embodiment is by no means limited to particular embodiments but various variations and modifications may be made without departing from the scope of the embodiment.

What is claimed is:

1. A ferroelectric memory device, comprising:
   a semiconductor substrate;
   a field effect transistor formed over said semiconductor substrate, said field effect transistor including first and second diffusion regions;
   an interlayer insulation film formed over said semiconductor substrate so as to cover said field effect transistor;
   a conductive plug formed in said interlayer insulation film in contact with said first diffusion region; and
   a ferroelectric capacitor formed over said interlayer insulation in contact with said conductive plug,
   said ferroelectric capacitor comprising a ferroelectric film and upper and lower electrodes sandwiching said ferroelectric film respectively from above and below,
   said lower electrode being connected electrically to said conductive plug,
   a layer containing aluminum and oxygen being interposed between said the conductive plug and said lower electrode,
   a layer containing nitrogen being interposed between said layer containing aluminum and oxygen and said lower electrode,
   a self-aligned layer of a substance having a self-orientation being interposed between said layer containing nitrogen and said lower electrode.

2. The ferroelectric memory device as claimed in claim 1, wherein said layer containing aluminum and oxygen comprises a TiAlN film having at least one oxygen atomic layer at a surface thereof.

3. The ferroelectric memory device as claimed in claim 2, wherein said TiAlN film has a thickness of 50-100 nm.

4. The ferroelectric memory device as claimed in claim 1, wherein said layer containing nitrogen contains at least one layer of nitrogen atomic layer.

5. The ferroelectric memory device as claimed in claim 1, wherein a surface of said layer containing nitrogen is terminated with hydrogen.

6. The ferroelectric memory device as claimed in claim 1, wherein said ferroelectric film has a (111) orientation.

7. The ferroelectric memory device as claimed in claim 1, wherein said self-aligned layer is formed of one or more substances selected from the group consisting of Ti, Ir, Pt, PZT, $SrRuO_3$, Ru, TiN, TiAlN, Al, Cu and IrOx.

8. The ferroelectric memory device as claimed in claim 1, wherein said conductive plug comprises one or more substances selected from the group consisting of Si, Ti, TiN, TiAlN, W, Al, Cu, Ru and $SrRuO_3$.

9. A method of fabricating a ferroelectric memory apparatus, comprising the steps of:
   forming an interlayer insulation film over a semiconductor substrate over which a transistor is formed so as to cover said transistor;
   forming a conductive plug in said interlayer insulation film in contact with a diffusion region of said transistor; and
   forming a ferroelectric capacitor over said conductive plug by consecutively stacking a lower electrode, a ferroelectric film and an upper electrode,
   wherein there is provided, after said step of forming said conductive plug but before said step of forming said lower electrode, the steps of: forming a layer containing aluminum and oxygen on said interlayer insulation film and a surface of said conductive plug; forming a layer containing nitrogen on a surface of said layer containing aluminum and oxygen; and forming a self-alignment film over said layer containing nitrogen.

10. The method as claimed in claim 9, wherein said step of forming said layer containing oxygen comprises the steps of deposing a TiAlN on said surface of said interlayer insulation film and said contact plug; and reacting oxygen radicals upon said TiAlN film.

11. The method as claimed in claim 9, wherein said step of forming said layer containing nitrogen comprises the step of reacting NH radicals to a surface of said layer containing oxygen.

12. The method as claimed in claim 9, wherein said step of forming said layer containing nitrogen comprises the step of reacting nitrogen radicals and hydrogen radicals to a surface of said layer containing oxygen.

13. The method as claimed in claim 9, wherein said step of forming said self-alignment film is conducted at a temperature of 300° C. or less.

14. The method as claimed in claim 9, wherein said step of forming said self-alignment film comprises the step of depositing a Ti film by a sputtering process.

15. A method of fabricating a semiconductor device having a function film, comprising the steps of:
   forming an interlayer insulation film over a semiconductor substrate over which a transistor is formed so as to cover said transistor;
   forming a conductive plug in said interlayer insulation film in contact with a diffusion region of said transistor; and
   forming a functional film over said conductive plug,
   wherein there is provided, after said step of forming said conductive plug but before said step of forming said functional film, the steps of: forming a layer containing aluminum and oxygen on said interlayer insulation film and a surface of said conductive plug; forming a layer containing nitrogen on a surface of said layer containing aluminum and oxygen; and forming a self-alignment film over said layer containing nitrogen.

* * * * *